(12) United States Patent
Tomizawa

(10) Patent No.: US 7,372,105 B2
(45) Date of Patent: May 13, 2008

(54) SEMICONDUCTOR DEVICE WITH POWER SUPPLY IMPURITY REGION

(75) Inventor: Tomohiro Tomizawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 121 days.

(21) Appl. No.: 11/139,679

(22) Filed: May 31, 2005

(65) Prior Publication Data

US 2005/0263820 A1 Dec. 1, 2005

(30) Foreign Application Priority Data

Jun. 1, 2004 (JP) ............................... 2004-162752

(51) Int. Cl.
*H01L 29/94* (2006.01)

(52) U.S. Cl. ............... 257/336; 257/335; 257/E27.098; 438/163

(58) Field of Classification Search ................ 257/335, 257/E27.098, 336; 275/336; 438/163
See application file for complete search history.

(56) References Cited

U.S. PATENT DOCUMENTS

| | | | | |
|---|---|---|---|---|
| 4,657,628 A | * | 4/1987 | Holloway et al. | .......... 438/647 |
| 4,879,254 A | * | 11/1989 | Tsuzuki et al. | .............. 438/273 |
| 5,879,968 A | * | 3/1999 | Kinzer | ......................... 438/135 |
| 6,051,860 A | * | 4/2000 | Odanaka et al. | ............. 257/316 |
| 6,500,705 B2 | * | 12/2002 | Kumagai | ..................... 438/223 |
| 6,538,275 B2 | * | 3/2003 | Sugiyama et al. | .......... 257/314 |
| 6,569,742 B1 | * | 5/2003 | Taniguchi et al. | .......... 438/303 |
| 6,885,529 B2 | * | 4/2005 | Ker et al. | ...................... 361/56 |
| 2004/0007744 A1 | | 1/2004 | Cho et al. | |

FOREIGN PATENT DOCUMENTS

JP 2004-47933 2/2004

OTHER PUBLICATIONS

Chinese Office Action, Jun. 8, 2007, Application No. 2005100754438.

* cited by examiner

*Primary Examiner*—Anh D. Mai
*Assistant Examiner*—Christopher M Roland
(74) *Attorney, Agent, or Firm*—McGinn IP Law Group, PLLC

(57) ABSTRACT

A semiconductor device in which by fixing a well at a predetermined potential via a contact within a memory cell, latch-up immunity is improved without accompanying increase in the area of the memory cell, and of which manufacture is facilitated, and a manufacturing method thereof. In a semiconductor device including MOS transistors each having an N-type impurity region 110 formed in a P-well 101 provided in a silicon substrate 100 thereof and including a GND contact 130 for supplying a GND potential to the P-well 101, a portion of an impurity region 110 is etched and removed. Then, a P-type diffusion layer 131 for power supply is formed in the etched and removed region in the silicon substrate. Power supply to the P-well 101 is then performed via the GND contact 130 connected to the power supply diffusion layer 131.

19 Claims, 18 Drawing Sheets

SEMICONDUCTOR DEVICE WITH POWER SUPPLY IMPURITY REGION

FIELD OF THE INVENTION

The present invention relates to a semiconductor memory device. More specifically, the invention relates to a semiconductor memory device having an SRAM (Static Random Access Memory) and a manufacturing method thereof.

BACKGROUND OF THE INVENTION

In recent years, with reduction of a chip size, a PN element isolation width within an SRAM cell is reduced. As a result, the capability of a parasitic bipolar transistor is improved, so that it becomes easy to enter into a latch up state in a memory cell. In order to enter into a latch up, trigger current is necessary. However, with miniaturization of the memory cell, electrical charges caused by deterioration in SER (Soft Error Rate) immunity tend to be generated. As a measure against this, it has become a general practice to form and dispose a subcontact or a well contact for every several to several tens of memory cells, and to fix P wells at a VSS potential and fix N wells at a VDD potential. However, it is necessary to secure a region for disposing subcontacts or well contacts in addition to the region of the memory cells, thereby leading to an increase in the chip size.

In order to cope with the problem as described above, implantation of $P^+$ impurity ions or $N^+$ impurity ions that have the same conductive type as that of a well into a portion of an $N^+$ diffusion layer that constitutes the source/drain of an N-type MOS transistor in an SRAM memory cell or a portion of a P+ diffusion layer that constitutes the source/drain of a P-type MOS transistor in the SRAM memory cell is performed, thereby forming a so-called Butted diffusion layer. Then, via the Butted diffusion layer, the well is fixed at a predetermined potential. Assume an N-type MOS transistor in which a P well 201 and an element isolation film (STI) 203 are formed in a silicon substrate 200, a gate insulating film 204 and a gate electrode 205 are formed over the element isolation film 203, and an N-type source/drain region 210 constituted from an $N^-$ diffusion layer 211 and an $N^+$ diffusion layer 212 is formed in the P-well 201, as illustrated in FIG. 16, for example. When a GND contact (contact hall) 230 for supplying the VSS potential or a GND potential herein to the P-well 201 is configured, a P-type impurity is implanted into a portion of the $N^+$ diffusion layer 212 in a high concentration, thereby forming a $P^+$ diffusion layer 231 as a Butted diffusion layer. Then, via this $P^+$ diffusion layer 231, power supply to the P-well 201 is performed. Incidentally, reference numeral 206 denotes sidewalls, reference numeral 207 denotes a silicide layer, and reference numeral 208 denotes an inter-layer film. In this structure, via the contact 230 and the Butted diffusion layer 231, the P-well can be fixed at the GND potential from metal wiring for supplying the GND potential fundamentally necessary for the memory cell. Further, via the contact hole and the Butted diffusion layer, an N-well region can be fixed at the VDD potential output from metal wiring for supplying the VDD potential fundamentally necessary for the memory cell. Thus, without increasing the well contact regions between the memory cells by design, deterioration of latch-up immunity can be prevented without increase in the area of the memory cell due to addition of wiring and connection hole(s) in the memory cell.

In order to form this Butted diffusion layer, however, it is necessary to form in a high-concentration $N^+$ diffusion layer or high-concentration $P^+$ diffusion layer the $P^+$ diffusion layer or the N+ diffusion layer of an opposite conductivity type, respectively, by implantation of high-concentration ions, as described before. Thus, the process for this becomes difficult. When the Butted diffusion layer is formed by implanting into a portion of the $N^+$ diffusion layer the P-type impurity ions of the same conductivity type as that of the well as described above, it is difficult to change the conductivity of the N+ diffusion layer having a concentration of $1E18/cm^2$ or higher, for example, which is present in the vicinity of the surface of the substrate as indicated by a result of a process simulation in FIG. 17, by implantation of a high dose of the P-type impurity ions.

On contrast therewith, in the technique disclosed in Patent Document 1, a portion of the $N^-$ type source/drain region 210 is formed to be shallow using the $N^-$ diffusion layer 211 alone, as shown in FIG. 18. Then, at least a portion of the silicide layer 207 formed on the $N^-$ diffusion layer 211 that constitutes the N-type source/drain region 210 or the $N^+$ diffusion layer 212 is formed to be deep to reach the P-well 201. Then, the P-well is fixed at the GND potential through the silicide layer 207. In the technique in this Patent Document 1, it is not necessary to change the conductivity of a high-concentration diffusion layer into the opposite conductivity type by ion implantation. Thus, it is advantageous in that manufacture of contacts becomes facilitated.

[Patent Document 1]
    JP Patent Kokai Publication No. JP-P2004-47933A

SUMMARY OF THE DISCLOSURE

In the technique in Patent Document 1, however, in order to form the silicide layer 207 to be formed deeper than the $N^-$ diffusion layer 211, it is necessary to perform silicidation at a high temperature for a long time. Thus, the silicide layer becomes thicker than necessary. The silicide layer in other regions than the gate electrodes and the source/drain regions, in particular, becomes thicker, thereby affecting the downsizing of elements for smaller geometries. Thermal damage will also be caused to the elements. Further, the silicide layer is directly connected to the wells. Thus, an electrical resistance between the silicide layer and the well is great. It is therefore difficult to fix the well at a predetermined potential. Further, only a portion (or portions) of the silicide layer is formed to be deeper. Thus, a special manufacturing step for formation of only the portion(s) of the silicide layer to be deeper is necessary, so that manufacturing of the semiconductor memory device therefore becomes difficult.

Thus there is much desired in the art for a semiconductor device in which by fixing a well at a desired potential through a contact, latch-up immunity is improved without accompanying an increase in the area of a memory cell, and of which manufacture can be facilitated, and a manufacturing method thereof.

According to an aspect of the present invention, a semiconductor device comprises: elements each including an impurity region formed in a well of one conductivity type provided in a semiconductor substrate thereof, the impurity region having a conductivity type opposite to the one conductivity type of the well, and contacts each for supplying a predetermined potential to the well. In the semiconductor deice, a portion of the impurity region is etched and removed; a power supply impurity region of the one conductivity type is formed in the etched and removed region in the semiconductor substrate; and power supply to the well is performed via the power supply impurity region.

In another aspect of the present invention, there is provided a method of manufacturing a semiconductor device. The manufacturing method of the semiconductor device is generally configured for forming a well of one conductivity type in a semiconductor substrate thereof and forming elements each including an impurity region in the well, the impurity region having a conductivity type opposite to the one conductivity type of the well. The method comprises the steps of: etching a portion of the impurity region to reach a well and removing the portion of the impurity region; implanting into the etched and removed region in the semiconductor substrate an impurity of a conductivity type opposite to the conductivity type of the etched and removed region, thereby forming a power supply impurity region; and forming a power supply contact to be electrically connected to the power supply impurity region.

The meritorious effects of the present invention are summarized as follows.

According to the present invention, the well can be fixed to the predetermined potential for each memory cell. Thus, inter-memory cell well contacts become unnecessary, or the number of the well contacts can be reduced, so that the latch-up immunity of elements or transistors in particular can be improved without increase in the chip size. Further, after the impurity region of one conductivity type has been etched and removed, the power supply impurity region of the opposite conductivity type is formed. Thus, the power supply impurity region can be readily formed, and manufacture of a contact structure for performing power supply to the well is facilitated. Further, there is no need for forming a silicide layer to be deeper than the impurity region. Thus, manufacture of the contact structure is further facilitated.

PREFERRED DESCRIPTION OF THE INVENTION

Figure 1:
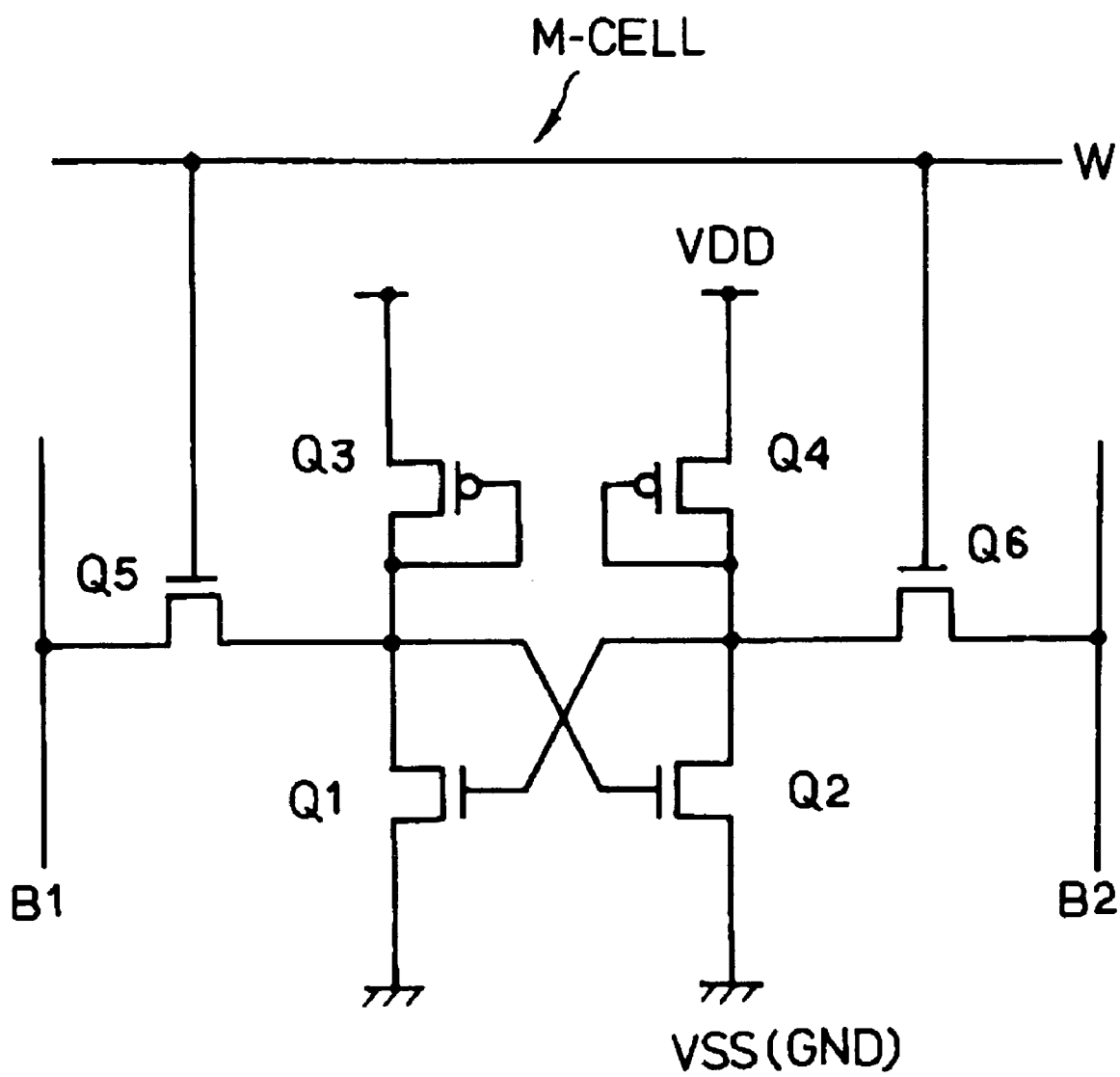
FIG. 1 is a circuit diagram of an SRAM memory cell according to an embodiment of the present invention.

In a semiconductor device of the present invention, it may be configured such that an impurity region is the source/drain region of an MOS transistor having an LDD structure, and a power supply impurity region is formed by etching and removing a low-concentration diffusion layer that constitutes a portion of the source/drain region. Alternatively, it may be configured such that the impurity region is a high-concentration diffusion layer that constitutes the source/drain region of the MOS transistor, and the impurity region for power supply is formed by etching and removing the high-concentration diffusion layer.

For example, it may be configured as follows: in a semiconductor device having a P-well and an N-well formed in a semiconductor substrate thereof and having N-type MOS transistors formed on the P-well and having P-type MOS transistors formed on the N-well, a P-type impurity region is formed by etching and removing a portion of the source/drain region of each of the N-type MOS transistor, and an N-type impurity region is formed by etching and removing a portion of the source/drain region of each of the P-type MOS transistors. A predetermined potential is supplied to the P-well via the P-type impurity region and a predetermined potential is supplied to the N-well via the N-type impurity region.

In the present invention, it is preferred that a silicide layer is formed on the surface of the impurity region, and that power supply to the impurity region and the wells is performed via the silicide layer. In the present invention, it is preferred that a memory cell is formed of an element, and that the power supply impurity region is provided for each of a plurality of memory cells formed on the semiconductor substrate.

In a manufacturing method of the semiconductor device of the present invention, an element formation process may be configured as follows: Namely it comprises a step of forming gate electrodes on a semiconductor substrate and forming low-concentration impurity regions by a self-alignment method using the gate electrodes, and a step of forming high-concentration impurity regions after sidewalls have been formed on both the sides of each of the gate electrodes. An etching process comprises a step of etching one of the sidewalls and each of the low-concentration impurity regions immediately under the one of the sidewalls. The process of forming the power supply impurity region includes a step of forming a power supply impurity region in a region in which each of the low-concentration impurity regions removed by the etching was present.

Alternatively, the element formation process may be configured as follows: That is, it comprises a step of forming gate electrodes on a semiconductor substrate and forming high-concentration impurity regions by a self-alignment method using the gate electrodes. An etching process comprises a step of etching a portion of each of the high-concentration impurity regions to be deeper than the impurity region. A process of forming the power supply impurity region comprises a step of forming a power supply impurity region in a region in which each of the high-concentration impurity regions removed by the etching was present.

First Embodiment

Next, embodiments of the present invention will be described with reference to the drawings. FIG. 1 is a circuit diagram of an SRAM memory cell M-CELL according to the present invention. The M-CELL is made up of driver transistors Q1 and Q2, load transistors Q3 and Q4, and transfer transistors Q5 and Q6. The driver transistors Q1 and Q2 are constituted from a pair of N-type MOS transistors with gates thereof mutually cross-connected. The load transistors Q3 and Q4 are constituted from P-type MOS transistors connected to the nodes of the driver transistors Q1 and Q2, respectively. The transfer transistors Q5 and Q6 are constituted from a pair of N-type MOS transistors connected between the node of the driver transistor Q1 and a bit line B1 and between the node of the driver transistor Q2 and a bit line B2, respectively, and with the gates thereof connected to a word line W. The load transistors Q3 and Q4 are connected to a VDD, while the driver transistors Q1 and Q2 are connected to a VSS (GND).

Figure 2:
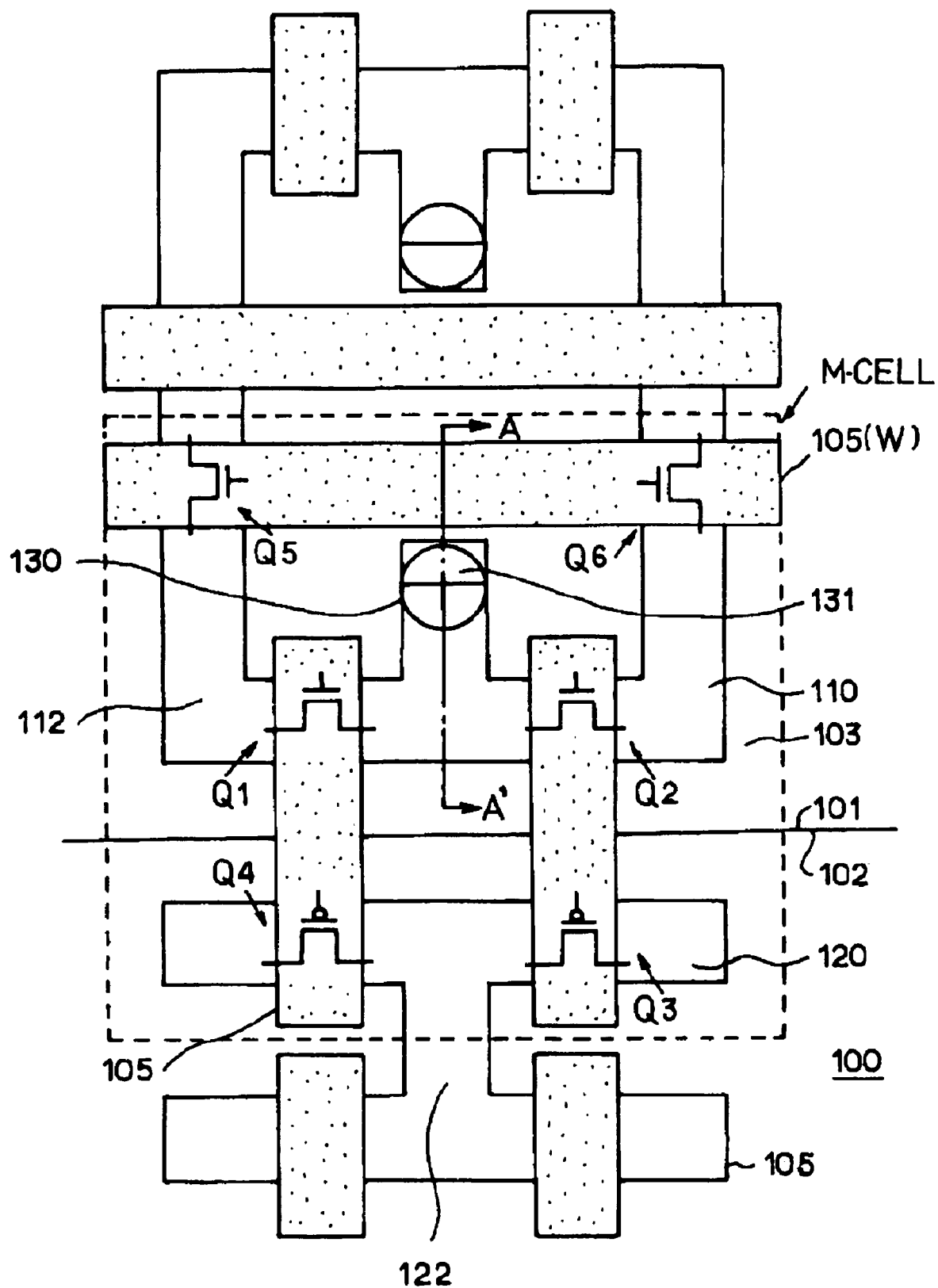
FIG. 2 is a layout diagram of a first embodiment.

FIG. 2 shows a top plan layout of the SRAM memory cell M-CELL, and a region indicated by a broken line shows one memory cell region. A P-well 101 and an N-well 102 are formed in a silicon substrate 100. Further, an element isolation region (STI) 103 is formed in the silicon substrate. By forming a polysilicon layer into predetermined patterns above the silicon substrate 100, gate electrodes 105 of respective MOS transistors are formed. A part of the gate electrodes 105 is constituted as a word line W shown in FIG. 1. Then, by the self-alignment method using the gate electrodes 105, an N-type source/drain region 110 is formed in the P-well 101, while a P-type source/drain region 120 is formed in the N-well 102. Then, in this first embodiment, GND contacts 130 for supplying a VSS potential (herein, a GND potential) to the P-well 101 is formed in a portion of the N-type source/drain region 110.

Figure 3:
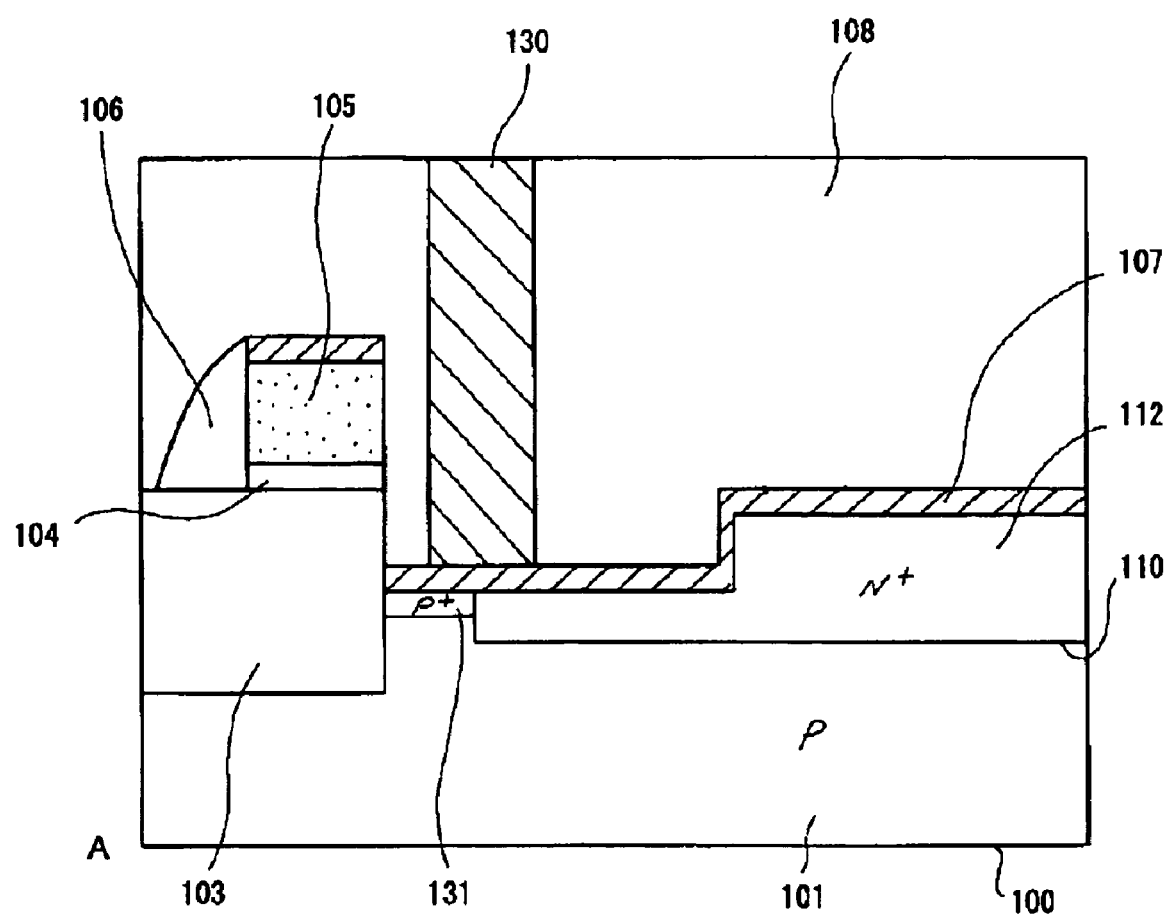
FIG. 3 is a cross sectional view taken along an A-A' line in FIG. 2.

FIG. 3 is a cross sectional view taken along an A-A' line in FIG. 2, which includes one of the GND contacts 130. The STI 103 and the P-well 101 are formed in the silicon substrate 100. The N-well 102 is not shown in the drawing. Above the silicon substrate 100, a gate insulating film 104 and one of the gate electrodes (constituting the word line) 105 formed of a polysilicon layer are formed. A sidewall 106 constituted from a silicon oxide film or the like is formed on the side of the one of the gate electrodes 105. The N-type source/drain region 110 is formed in the P-well 101 on both sides of the respective gate electrodes 105, and together with the gate electrodes 105, the N-type MOS transistors Q1, Q2, Q5, and Q6 are constituted. As clear from the description about the manufacturing process which will be described later, the N-type source/drain region 110 is constituted from a low-concentration N⁻ diffusion layer 111 formed immediately under one of the sidewalls 106 and a high-concentration N⁺ diffusion layer 112 formed in a region other than regions immediately under the one of the sidewalls 106, and a configuration as the MOS transistor of a so-called LDD structure is thereby made. The same principle applies for the P-type MOS transistors Q3 and Q4, too. Namely, the P-type source/drain region 120 is constituted from a low-concentration P⁻ diffusion layer immediately under one of the sidewalls 106 and a high-concentration P⁺ diffusion layer in other region than those.

Referring to the GND contacts 130, in the regions of the P-well 101 different from the regions where the N-type MOS transistors Q1, Q2, Q3, and Q4 are formed, a portion of the sidewalls 106 is etched, and etching is performed to the depth of the N⁻ diffusion layer 111 over portions of the surface of the silicon substrate 100. In the etched area being adjacent to the N⁺ diffusion layer 112 (i.e. extending between an STI 103 and N⁺ diffusion layer 112), a P⁺ diffusion layer 131 is formed. Then, a silicide layer 107 that uses a metal with a high melting point is formed on the upper surfaces of the gate electrodes and the surface of the source/drain region 110. Further, an inter-layer film 108 is formed over an entire surface, and using a conductive material buried in contact holes opened in the inter-layer film 108, electrical connections to the silicide layer 107 are made, so that the GND contacts 130 are formed.

Figure 4A:
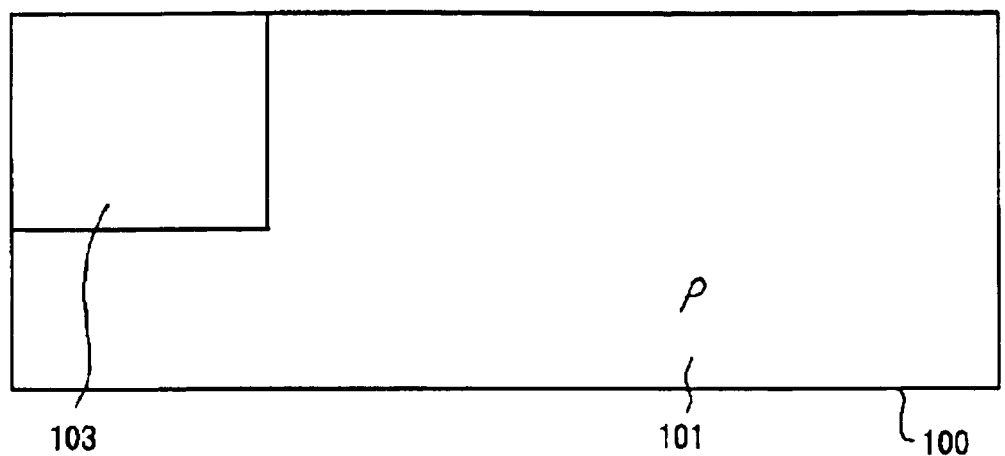
FIGS. 4a and 4b include first cross sectional views showing manufacturing steps of the first embodiment.

FIGS. 4a, 4b, 5a, 5b, 6a and 6b are cross sectional views taken in the same section as FIG. 3, which show manufacturing steps of a semiconductor device including the memory cell M-CELL in FIGS. 2 and 3. First, as shown in FIG. 4a, a shallow trench is formed in a required region in the silicon substrate 100, and an insulating material such as a silicon oxide film or the like is buried in this trench, thereby forming the STI 103. Next, a P-type impurity is selectively diffused onto the silicon substrate 100, thereby forming the P-well 101. Further, an N-type impurity is diffused onto other region of the silicon substrate 100, thereby forming the N-well 102, though not shown in these figures (Refer to FIG. 2).

Figure 4B:
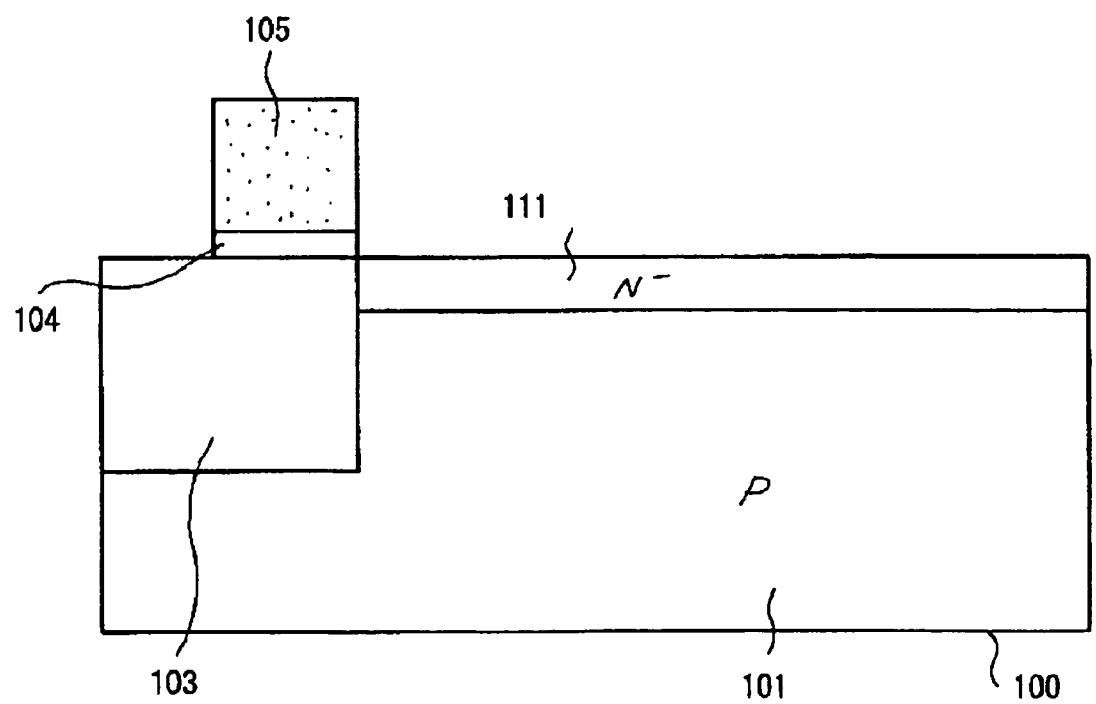

Next, as shown in FIG. 4b, the gate insulating film 104 is formed above the silicon substrate 100 (more exactly on the STI) using the silicon oxide film or the like. Then, a polysilicon layer is formed thereon. By forming the polysilicon layer into required patterns, the gate electrodes 105 are formed. Then, a N-type impurity is implanted into a region in which the N-type MOS transistors will be formed, in a low concentration, thereby forming the N⁻ type diffusion layer 111. Further, on the other hand a P-type impurity is implanted into a region in which the P-type MOS transistors will be formed, in a low concentration, thereby forming the P⁻ diffusion layer (not shown in the figure).

Figure 5A:
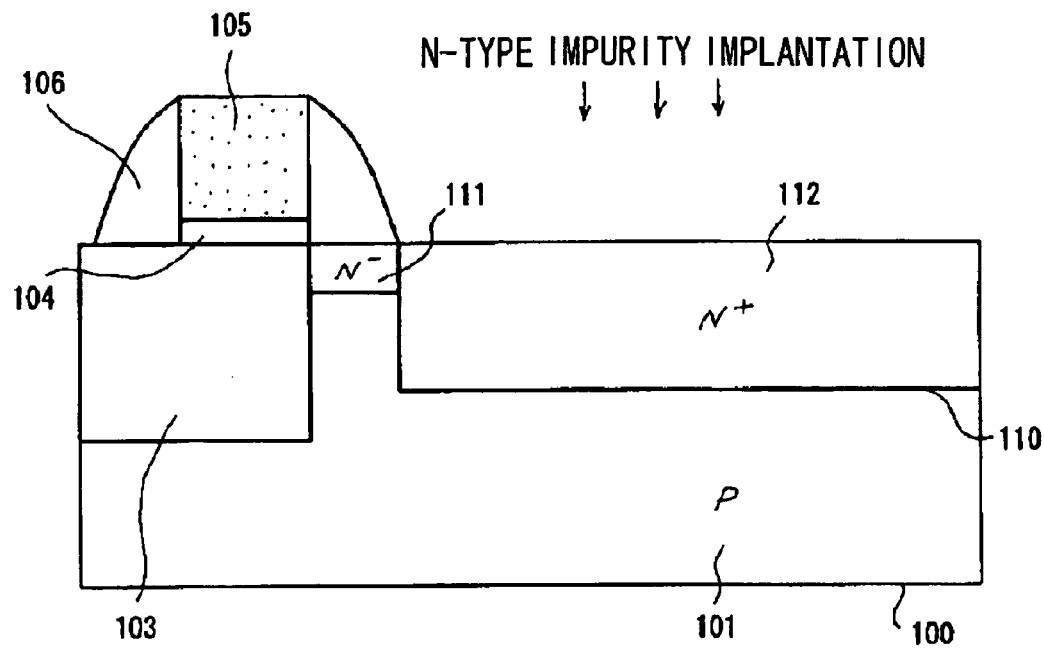
FIGS. 5a and 5b include second cross sectional views showing manufacturing steps of the first embodiment.

Next, as shown in FIG. 5a, the silicon oxide film is formed over the entire surface, and anisotropic etching (or selective etching) is performed on it, thereby forming the sidewalls 106 on both the sides of the gate electrodes. Then, the N-type impurity is implanted into the region in which the N-type MOS transistors will be formed, in a high concentration, thereby forming the N⁺ diffusion layer 112. With this arrangement, the N-type source/drain region 110 is formed, so that the N-type MOS transistors Q1, Q2, Q5, and Q6 having the LDD structure are formed. Further, on the other hand, though not shown, the P-type impurity is implanted into the region in which the P-type MOS transistors will be formed, in a high concentration, thereby forming the P⁺ diffusion layer, so that the P-type MOS transistors with the LDD structure are formed.

Figure 5B:
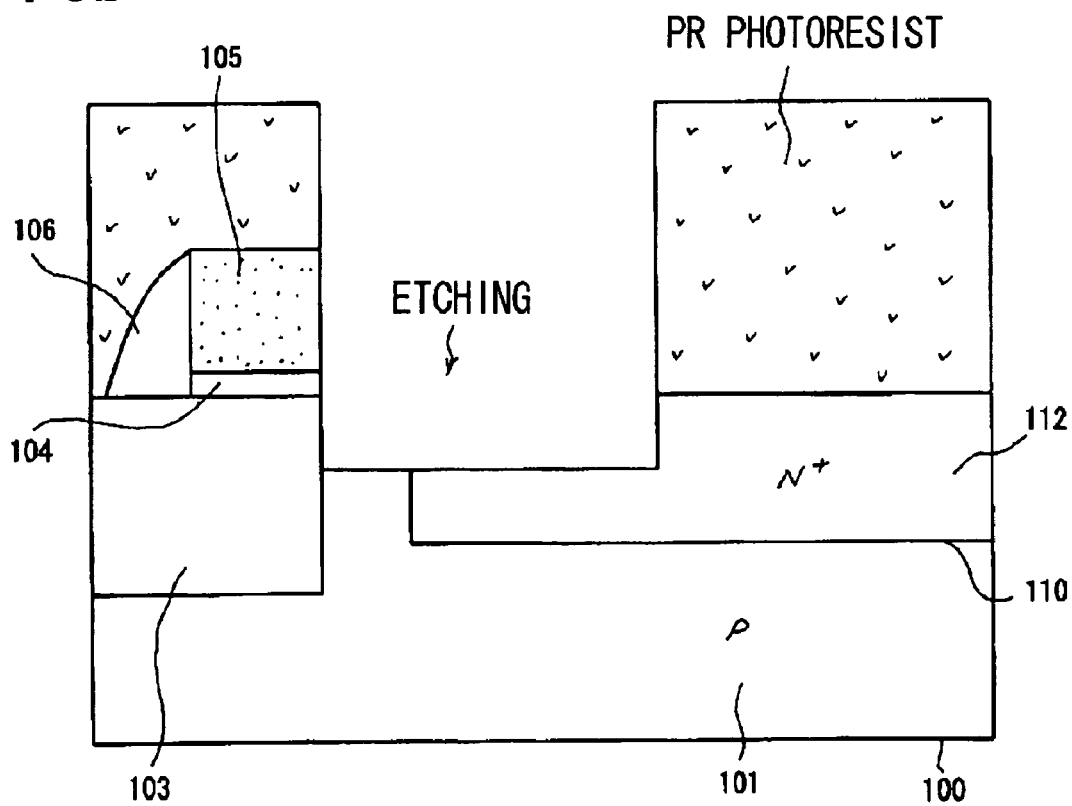

Next, as shown in FIG. 5b, the region excluding the regions in which the GND contacts 130 are formed is masked by a photoresist PR, and the silicon substrate 100 is etched to at least the depth of the N⁻ diffusion layer 111, together with one of the sidewalls 106. With this arrangement, in the region of each of the GND contacts 130, the N⁻ diffusion layer 111 and a portion of the N⁺ diffusion layer 112 adjacent to this are etched and removed.

Figure 6A:
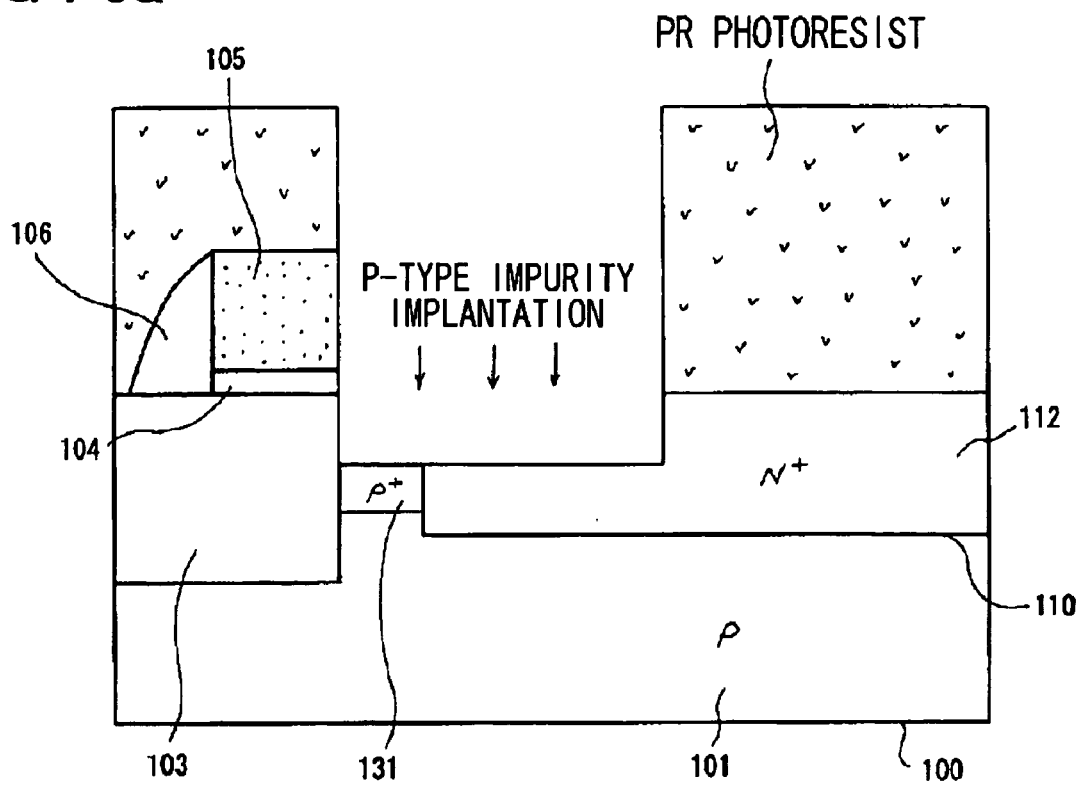
FIGS. 6a and 6b include third cross sectional views showing manufacturing steps of the first embodiment.

Next, as shown in FIG. 6a, the p-type impurity is introduced (implanted) into the etched regions with the photoresist PR used as a mask. With this arrangement, the P⁺ diffusion layer 131 for supplying power to the P-well 101 is formed in the regions from which the N⁻ diffusion layer 111 has been removed. Incidentally, even with the introduction of the P-type impurity, the N⁺ diffusion layer 112 is left without substantial alteration due to the high concentration of the N-type impurity, though the N-type concentration of the region of the N+ diffusion layer 112 is slightly reduced.

Figure 6B:
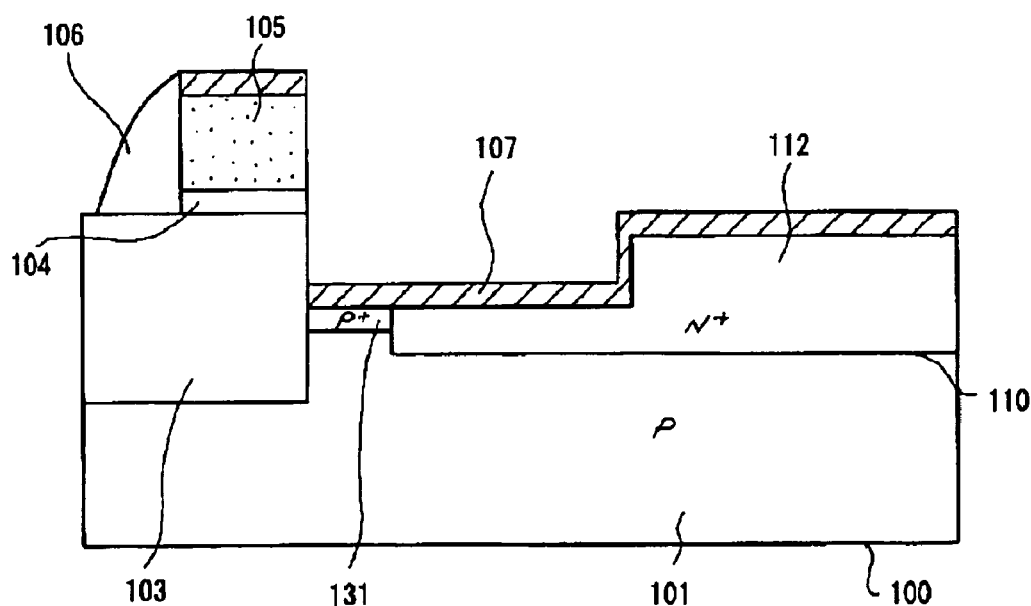
Figure 7A:
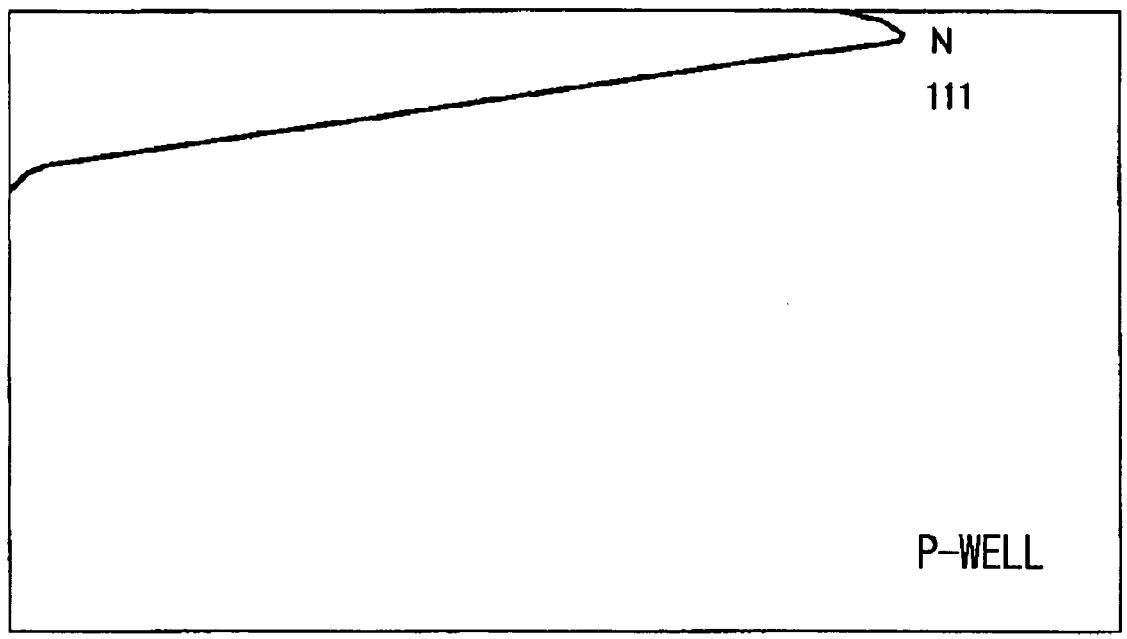
FIGS. 7a and 7b are diagrams for explaining concentration distributions in an impurity region.
Figure 7B:
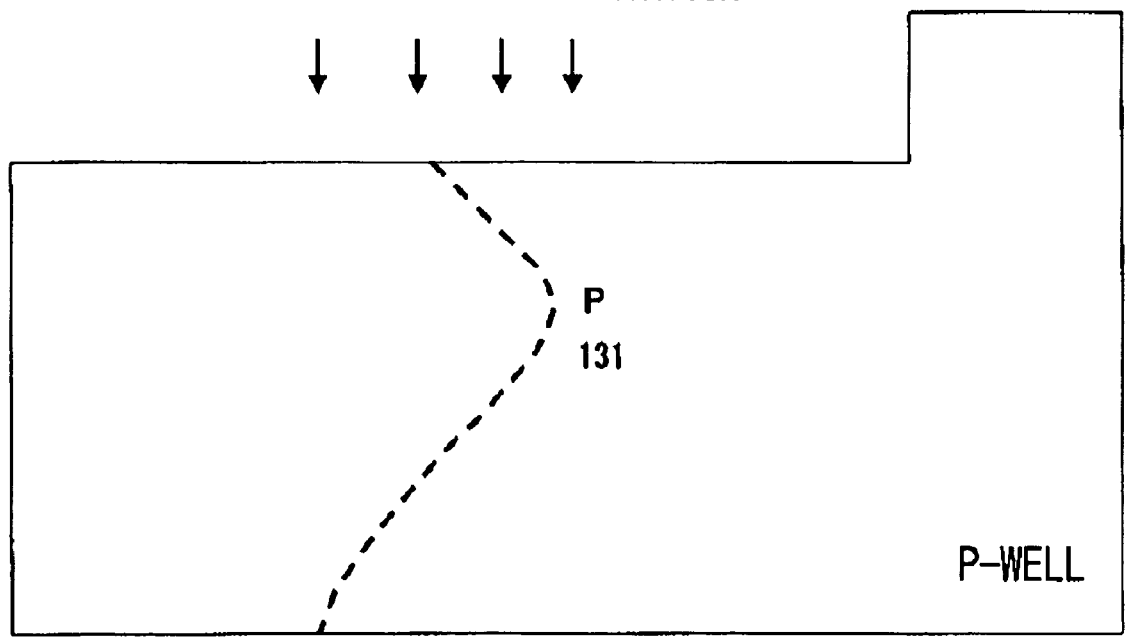

Next, as shown in FIG. 6b, after the photoresist PR has been removed, a metal film with a high melting point such as cobalt is formed above the entire surface of the silicon substrate 100. Then, by a heating treatment, a silicide layer 107 is formed on the upper surfaces of the gate electrodes 105 and the surfaces of the diffusion layers 112 and 131. After the cobalt that is not silicided has been removed, the inter-layer film 108 is formed as shown in FIG. 3. Then, the contact holes are opened in regions including the P+ diffusion layer 131, and a metal such as tungsten is buried therein, so that the GND contacts 130 to be connected to the GND potential are completed.

As described above, in the SRAM memory cells in the first embodiment, the P-well 101 for each memory cell can be fixed at the GND potential through the GND contact 130. Thus, deterioration of latch-up immunity can be prevented. With this arrangement, it becomes unnecessary to secure a region for disposing subcontacts or well contacts in addition to the region of the memory cells, so that the chip size can be reduced. Further, for formation of the GND contact 130, a portion of the N− diffusion layer 111 is etched and removed, and then the P+ diffusion layer 131 is formed on the etched and removed region. Thus, it is not necessary to form the P+ diffusion layer 131 by changing the conductivity of the N+ diffusion layer 112 by a high-concentration P-type impurity. Thus, manufacturing can be readily performed. Further, there is no need for forming a portion of the silicide layer to be deeper than the N− diffusion layer as in Patent Document 1, so that manufacturing can easily be performed in this respect as well.

Incidentally, as shown in a simulation of an impurity distribution in FIG. 5, the concentration distribution of the N-type impurity when the N− diffusion layer 111 is formed is as shown in FIG. 5(a). The N-type impurity is removed when the etching is performed. Thus, when the P-type impurity is implanted thereafter, the concentration distribution of the P+ diffusion layer 131 as shown in FIG. 5(b) can be readily obtained.

Second Embodiment

Figure 8:
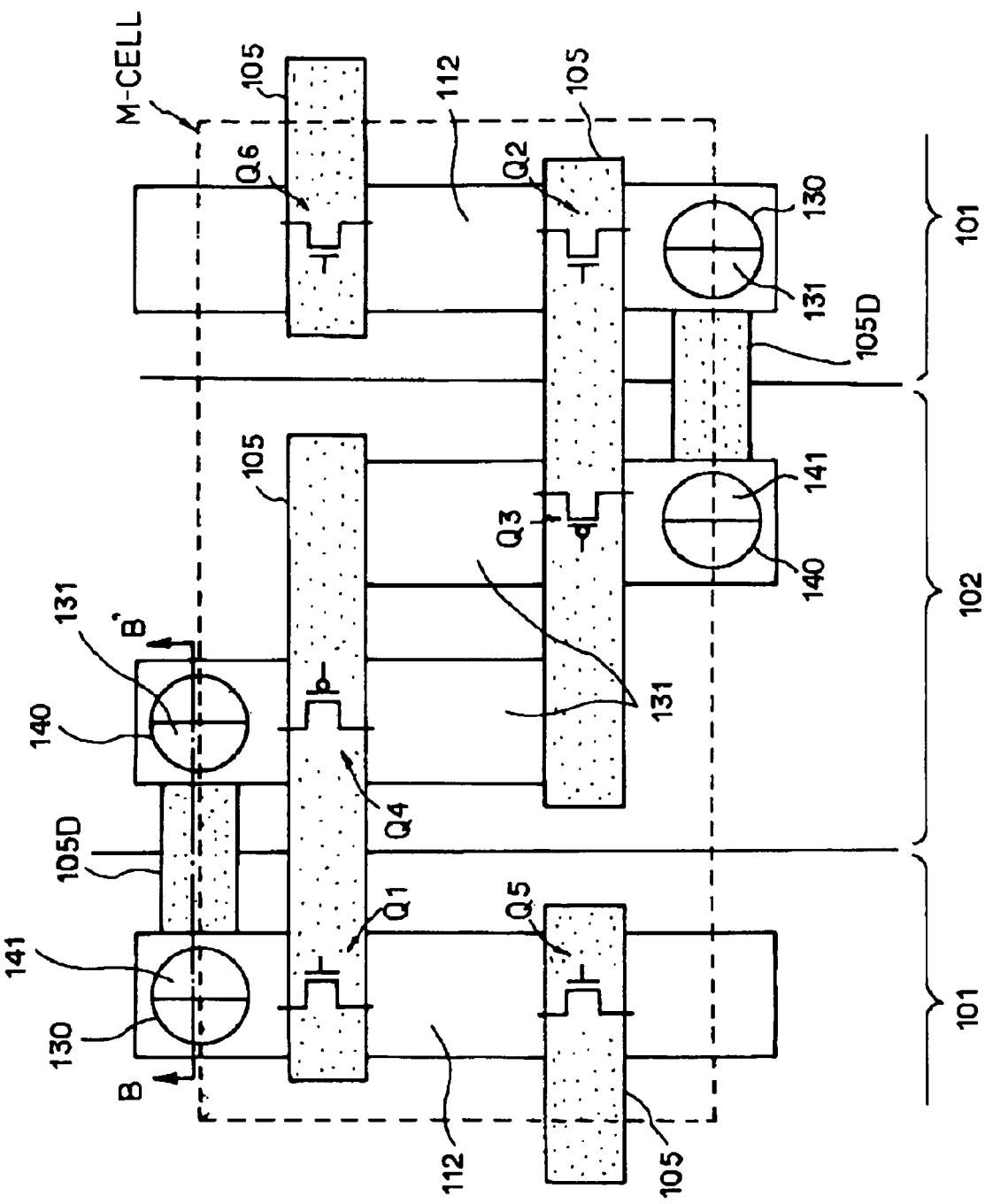
FIG. 8 is a layout diagram of a second embodiment.
Figure 9:
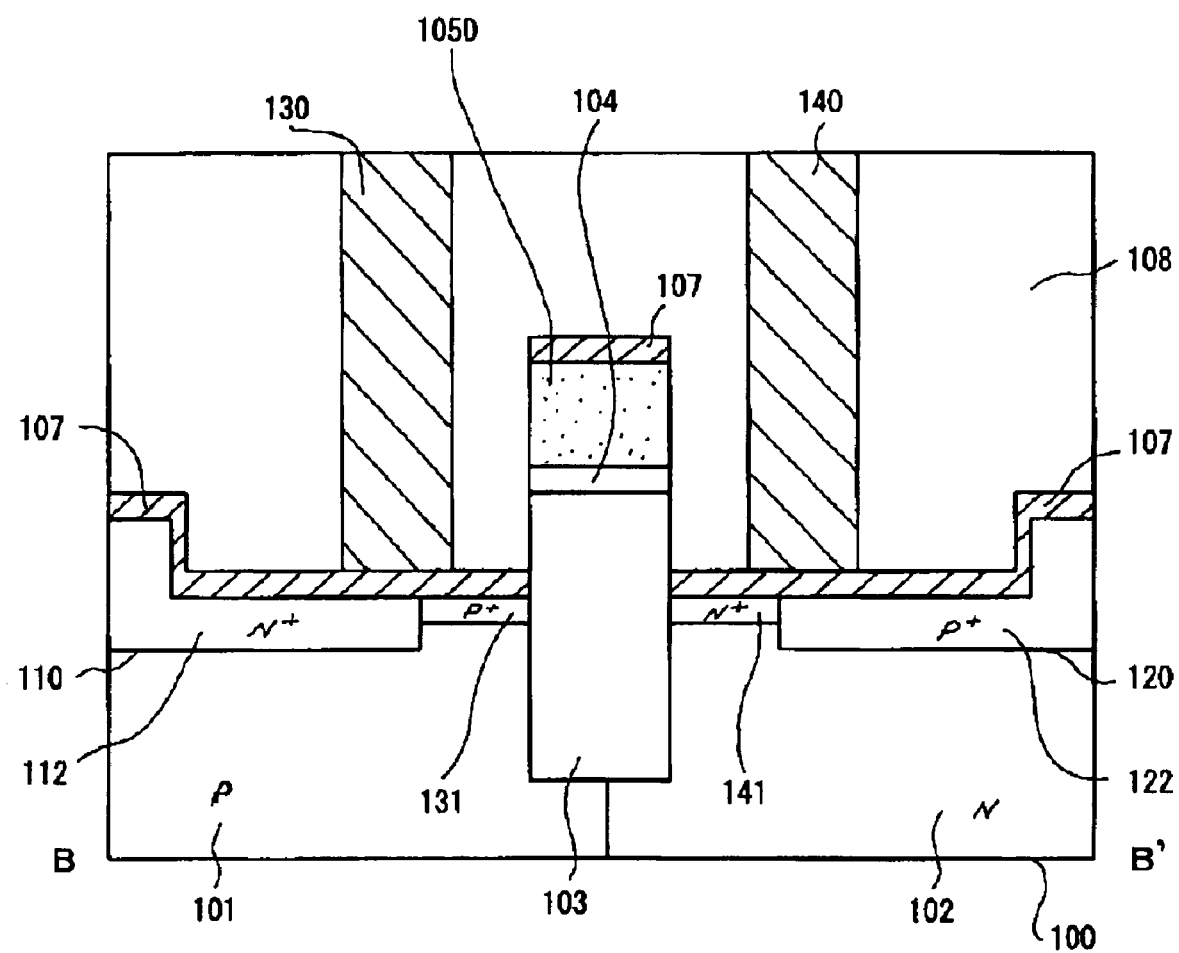
FIG. 9 is a cross sectional view taken along a B-B' line of FIG. 8.

FIG. 8 is a top plan layout diagram of a second embodiment of the present invention, and FIG. 9 is a cross sectional view taken along a B-B' line of FIG. 8. The second embodiment is an example in which the GND contact 130 is provided for the P-well 101, and a VDD contact 140 is provided for the N-well 102. Though the SRAM memory cell M-CELL has the same circuit configuration as that shown in FIG. 1, pattern shapes of the gate electrodes and the source/drain regions of the MOS transistors are different. However, the basic configuration is the same as that in the first embodiment. Thus, by assigning the same reference characters to components that are equivalent to those in the first embodiment, detailed descriptions of them will be omitted. In the second embodiment, a dummy gate 105D is formed so as to form the GND contact 130 and the VDD contact 140, and in regions adjacent to this dummy gate 105, the GND contact 130 and the VDD contact 140 are formed.

More specifically, as shown in FIG. 8, the dummy gate 105D is formed to be disposed between N-type source/drain region 110 and the P-type source/drain region 120, and is formed in the same layer configuration as that for the gate electrodes of the MOS transistors. Then, as shown in FIG. 9, portions of the sidewalls 106 formed on both the sides of the dummy gate 105D are etched. Further, the silicon substrate 100 thereunder is etched to a predetermined depth. The P+ diffusion layer 131 and an N+ diffusion layer 141 are formed in these etched regions, and the silicide layer 107 is formed thereon. Then, a conductive material is buried in contact holes provided in the inter-layer film 108, and electrical connections are established with the P+ diffusion layer 131 and the N+ diffusion layer 141, respectively, through the silicide layer 107, thereby constituting the GND contact 130 and the VDD contact 140, respectively.

Figure 10A:
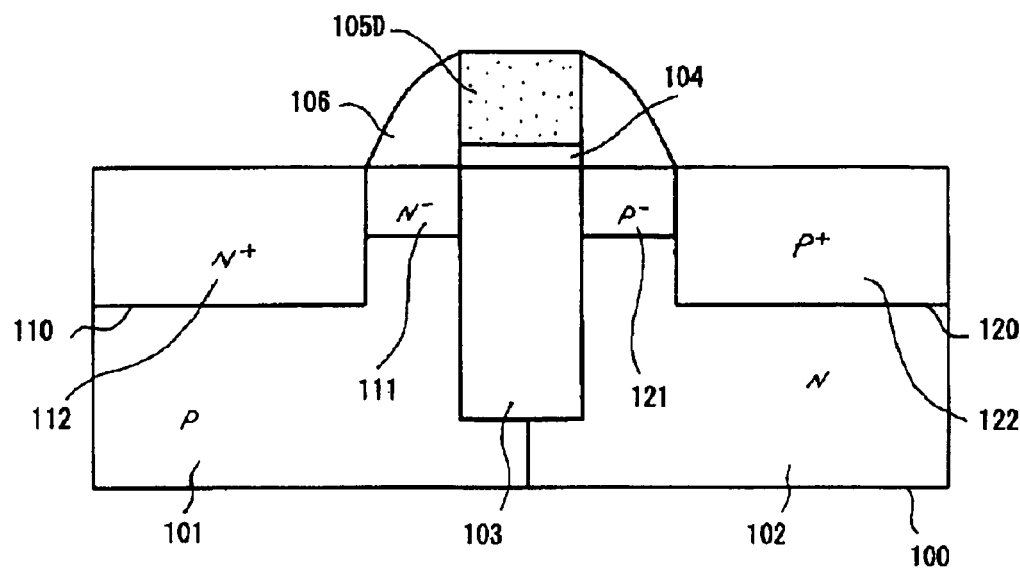
FIGS. 10a and 10b include first cross sectional views showing manufacturing steps of the second embodiment.

FIGS. 10a, 10b, 11a, 11b, 12a and 12b are sectional views taken in the same direction as FIG. 8 and shows parts of manufacturing steps in the second embodiment. First, as shown in FIG. 10a, the P-well 101, N-well 102, and STI 103 are formed in the silicon substrate 100, and the gate insulating film 104 and the gate electrodes 105 are formed, as in the first embodiment. At this point, the dummy gates 105D are simultaneously formed. Then, by the self-alignment method using the gate electrodes 105 and the dummy gates 105D, the N− diffusion layer 111 is formed in the P-well 101, and a P− diffusion layer 121 is formed in the N-well. Next, the sidewalls 106 are formed on both the sides of each of the gate electrodes 105 and the dummy gates 105D using the same technique as in the first embodiment. Then, by the self-alignment method using the sidewalls 106, the N+ diffusion layer 112 is formed in the P-well 101, and a P+ diffusion layer 122 is formed in the N-well 102. With this arrangement, the source/drain regions 110 and 120 for the MOS transistors Q1 to Q6 of an N type and a P type, having the LDD structure, are formed.

Figure 10B:
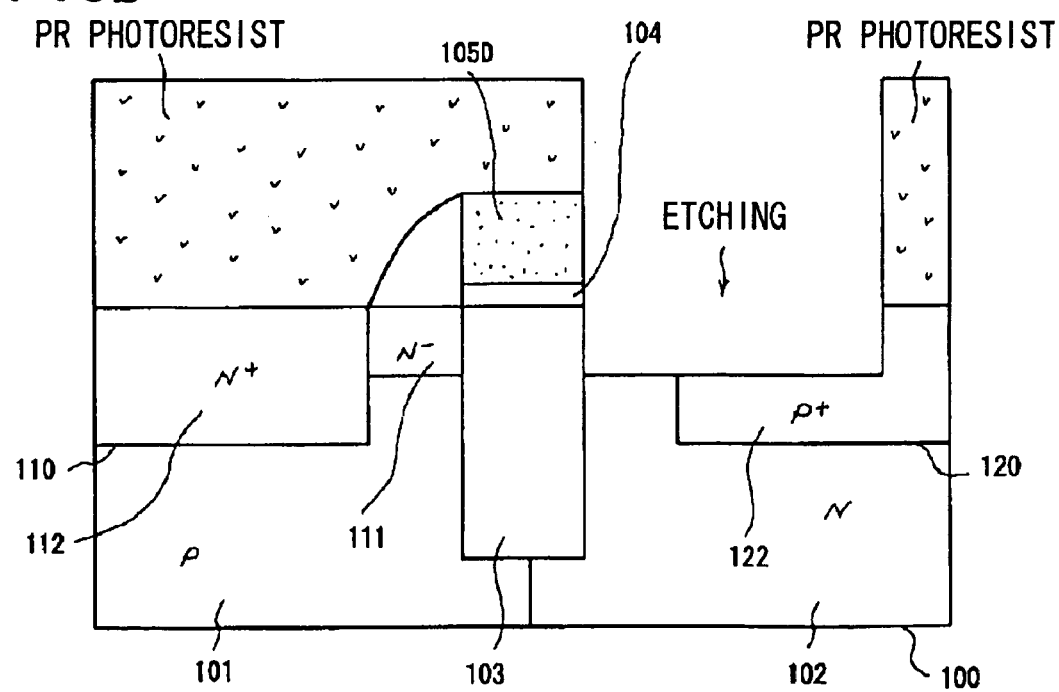
Figure 11A:
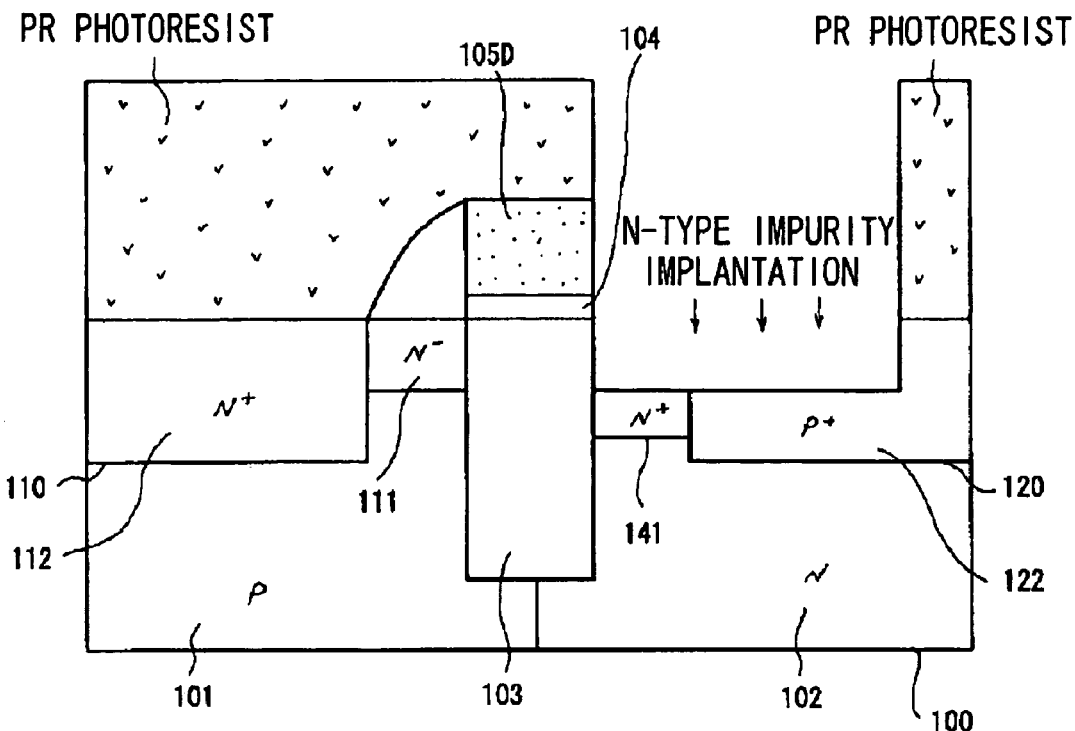
FIGS. 11a and 11b include second cross sectional views showing manufacturing steps of the second embodiment.
Figure 11B:
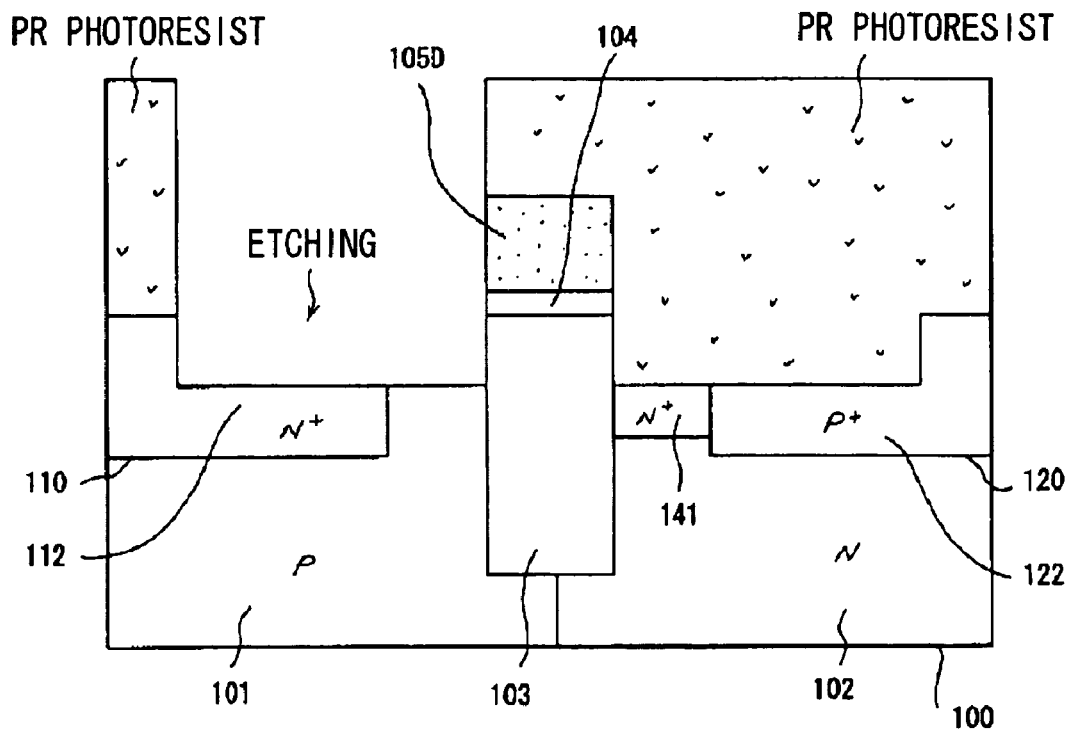

Next, as shown in FIG. 10b, the region excluding the regions in which the VDD contacts 140 are formed is masked by the photoresist PR, and portions of the side walls 106 and the silicon substrate 100 are etched to at least the depth of the P− diffusion layer 121. With this arrangement, the P− diffusion layer 121 and a portion of the P+ diffusion layer 122 are etched and removed from the region of each of the VDD contacts 140.

Next, as shown in FIG. 8-B(a), using the photoresist PR as the mask, the N-type impurity is introduced into the etched regions. With this arrangement, the N+ diffusion layer 141 is formed in the regions from which the P− diffusion layer 121 has been removed. The concentration of the P-type impurity is higher in the P+ diffusion layer 122 (compared to N-type). Thus, the P+ diffusion layer 122 is left without alteration, though the concentration of the P-type impurity is slightly reduced.

Next, as shown in FIG. 8-B(b), the region excepting the regions in which the GND contacts 130 are formed is masked by the photoresist PR, and portions of the sidewalls and the silicon substrate 100 are etched to at least the depth of the N− diffusion layer 111. With this arrangement, the N− diffusion layer 111 and a portion of the N+ diffusion layer 112 adjacent to this are etched and reduced from the region of the N+ diffusion layer 112.

Figure 12A:
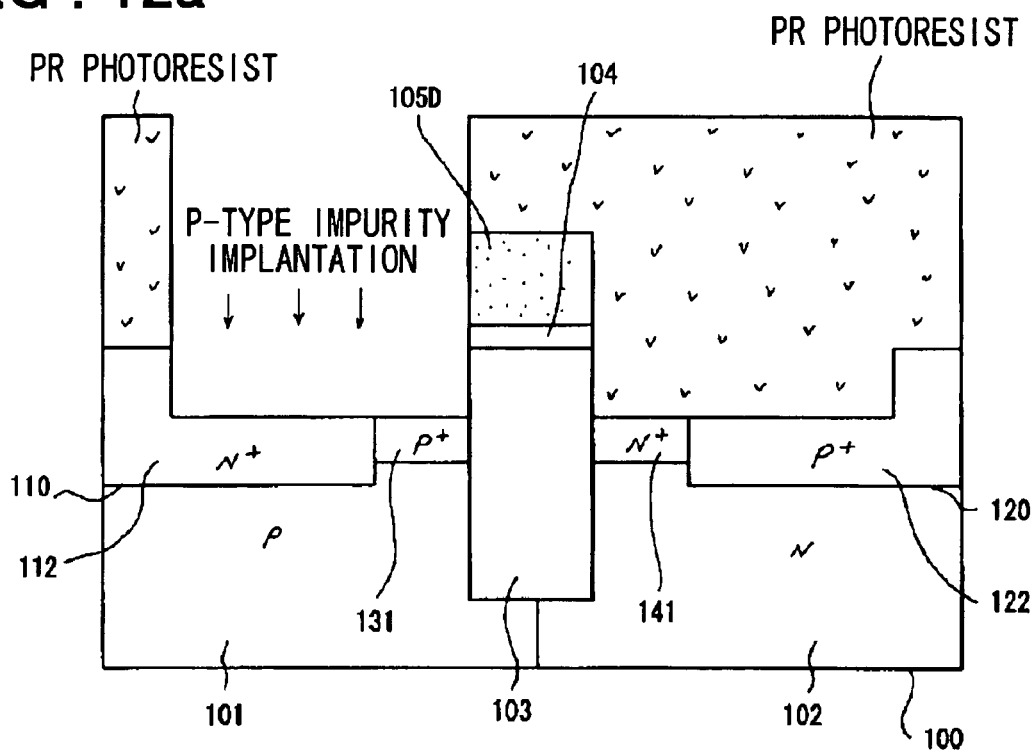
FIGS. 12a and 12b include third cross sectional views showing manufacturing steps of the second embodiment.

Next, as shown in FIG. 12a, using the photoresist PR as the mask, the P-type impurity is introduced into the etched regions. With this arrangement, the P+ diffusion layer 131 is formed in the regions from which the N− diffusion layer 111 has been removed. The concentration of the N-type impurity is higher in the N+ diffusion layer 112. Thus, the N+ diffusion layer 112 is left without substantial alteration, though the concentration of the N-type impurity is slightly reduced.

Figure 12B:
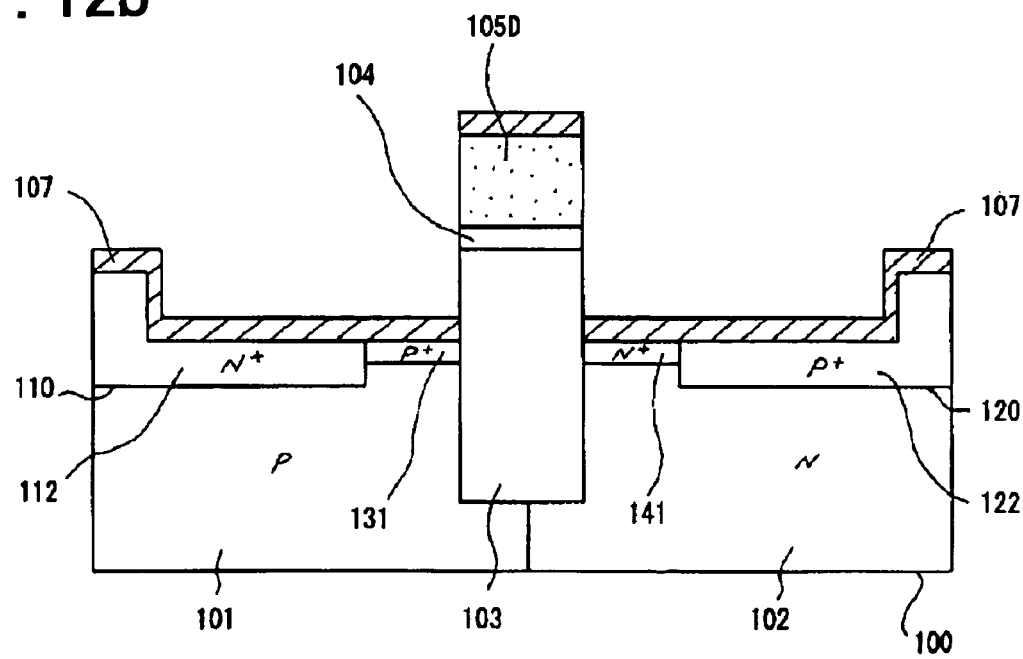

Next, as shown in FIG. 12b, after the photoresist PR has been removed, a metal film with a high melting point such as cobalt is formed above the entire surface of the silicon substrate 100. Then, by the heat treatment, the silicide layer 107 is formed on the upper surfaces of the gate electrodes 105 including the dummy gates 105D and the surfaces of the source/drain regions 110 and 120. After the cobalt that is not silicided has been removed, the inter-layer film 108 is formed as shown in FIG. 9. Then, the contact holes are opened in regions including the P+ diffusion layer 131 and the N+ diffusion layer 141, and a metal such as tungsten is buried therein, so that the GND contacts 130 to be connected to the GND potential and the VDD contacts 140 to be connected to the VDD potential are completed.

As described above, in each of the SRAM memory cells in the second embodiment, the GND potential can be supplied to the P-well 101 via the GND contact 130, whereas the VDD potential is supplied to the N-well 102 via the VDD contact 140. The P-well 101 can be fixed at the GND potential, and the N-well 102 is fixed at the VDD potential, thereby fixing both of the wells securely. Thus, the latch-up immunity can be more improved. Further, as in the first embodiment, it is not necessary to secure a region for disposing the subcontacts or the well contacts in addition to the region of the memory cells, so that the chip size can be reduced. Further, when the GND contacts 130 are formed, the $N^-$ diffusion layer 111 of the source/drain region 110 is removed by etching, and then the $P^+$ diffusion layer 131 as the diffusion layer for power supply is formed. Thus, it is not necessary to form the $P^+$ diffusion layer 131 by changing the conductivity of the $N^+$ diffusion layer 112 by doping a high-concentration P-type impurity. Likewise, when the VDD contacts 140 are formed, the $P^-$ diffusion layer 121 of the P-type source/drain region 120 is removed by etching, and then the $N^+$ diffusion layer 141 as the diffusion layer for power supply is formed. Thus, it is not necessary to form the $N^+$ diffusion layer 141 by changing the conductivity of the $P^+$ diffusion layer 122 by doping a high-concentration N-type impurity. Thus, manufacture of each contact can be readily performed. Further, it is not necessary to form a portion of the silicide layer to be deeper than the N+ diffusion layer and the P+ diffusion layer as in Patent Document 1. The manufacturing can be readily performed in this respect as well.

Third Embodiment

Figure 13:
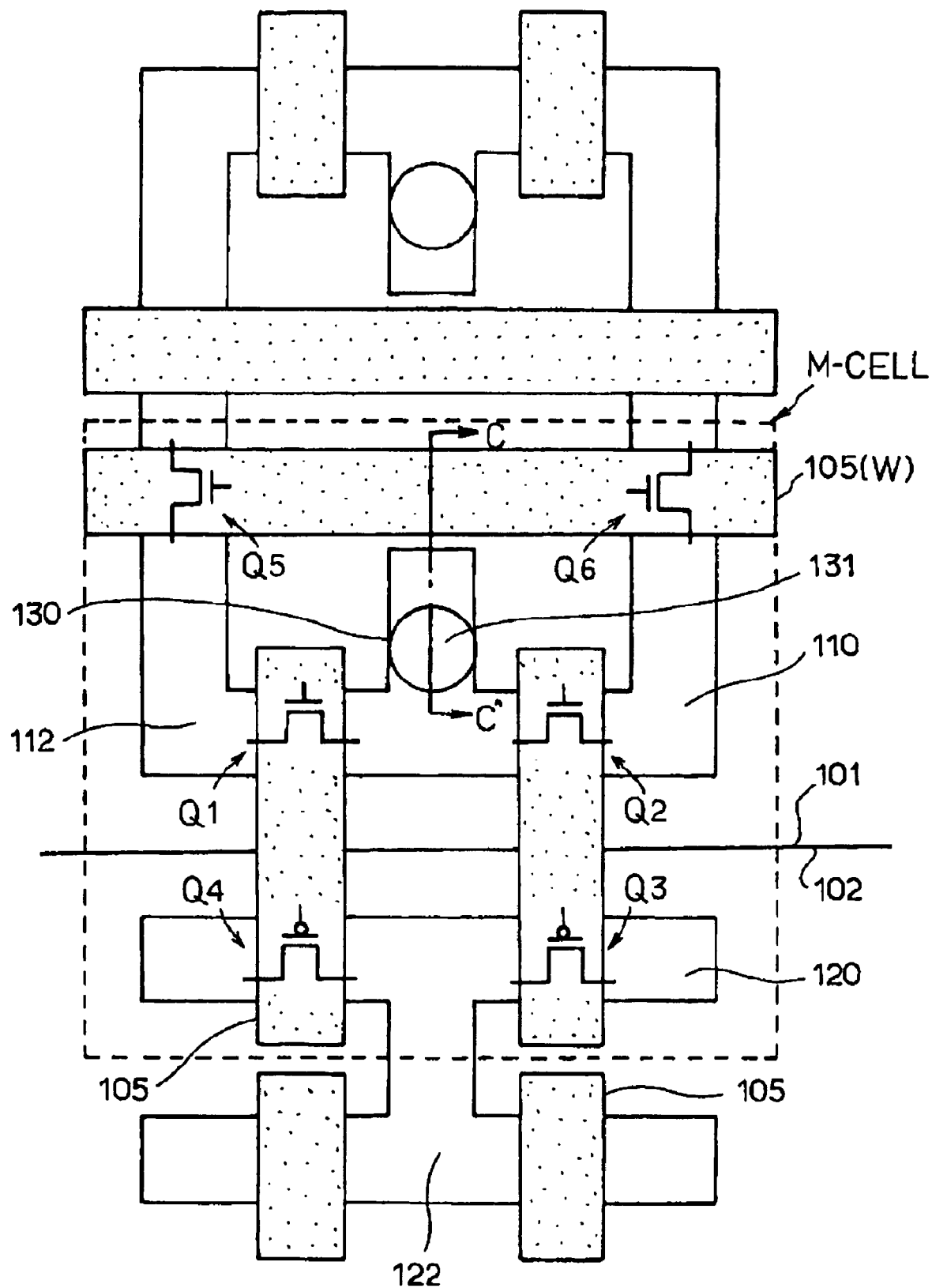
FIG. 13 is a layout diagram showing a third embodiment.
Figure 14:
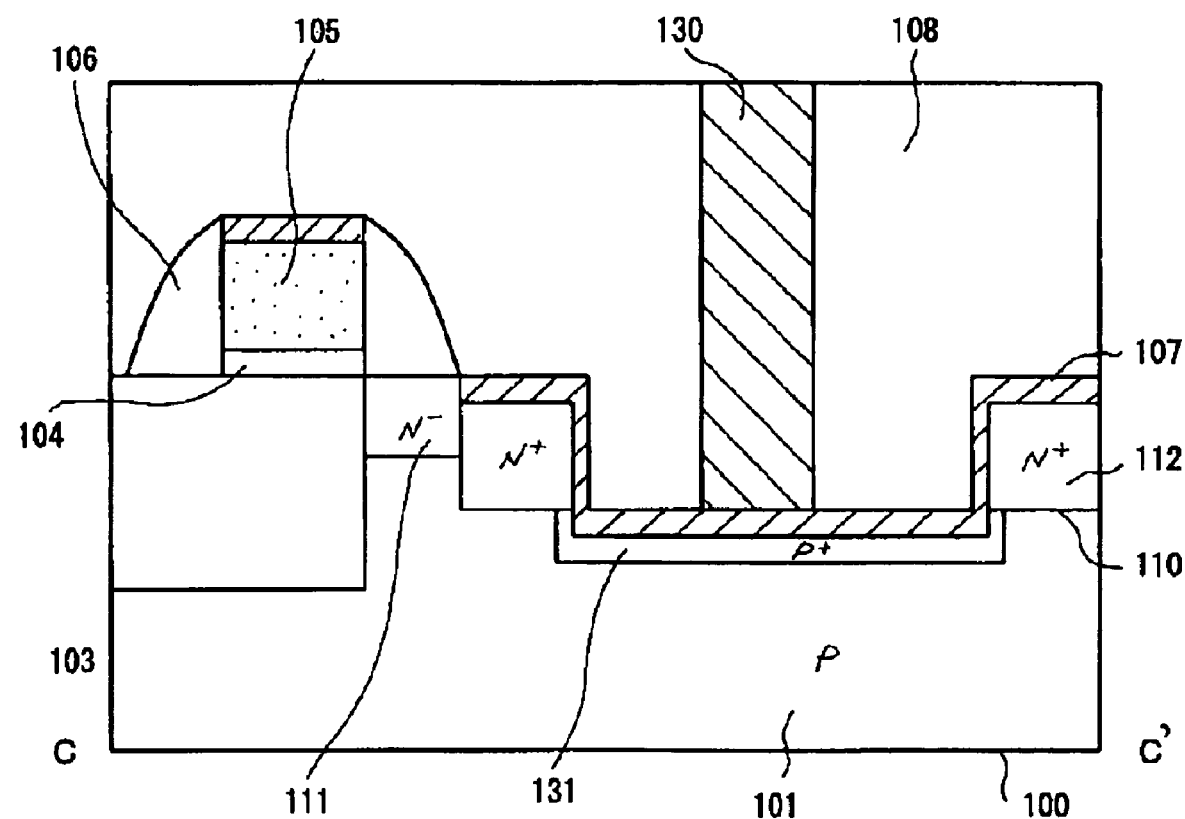
FIG. 14 is a cross sectional view taken along a C-C' line in FIG. 13.

FIG. 13 is a layout diagram of an SRAM memory cell according to a third embodiment of the present invention. FIG. 14 is a cross sectional view taken along a C-C' line in FIG. 13, and shows an example of a variation of the first embodiment. By assigning the same reference characters to components that are equivalent to those in FIGS. 2 and 3, detailed descriptions of them will be omitted. In the third embodiment, a portion of the $N^+$ diffusion layer 112 that constitutes the source/drain region 110 of an N-type MOS transistor is etched, and the GND contact 130 is formed in this etched region. More specifically, the $N^-$ diffusion layer 111 is not etched as in the first embodiment. Then, the portion of the $N^+$ diffusion layer 112 is etched to a depth deeper than the depth of the $N^+$ diffusion layer 112. The $P^+$ diffusion layer 131 is formed in this etched region, thereby forming the GND contact 130.

Figure 15A:
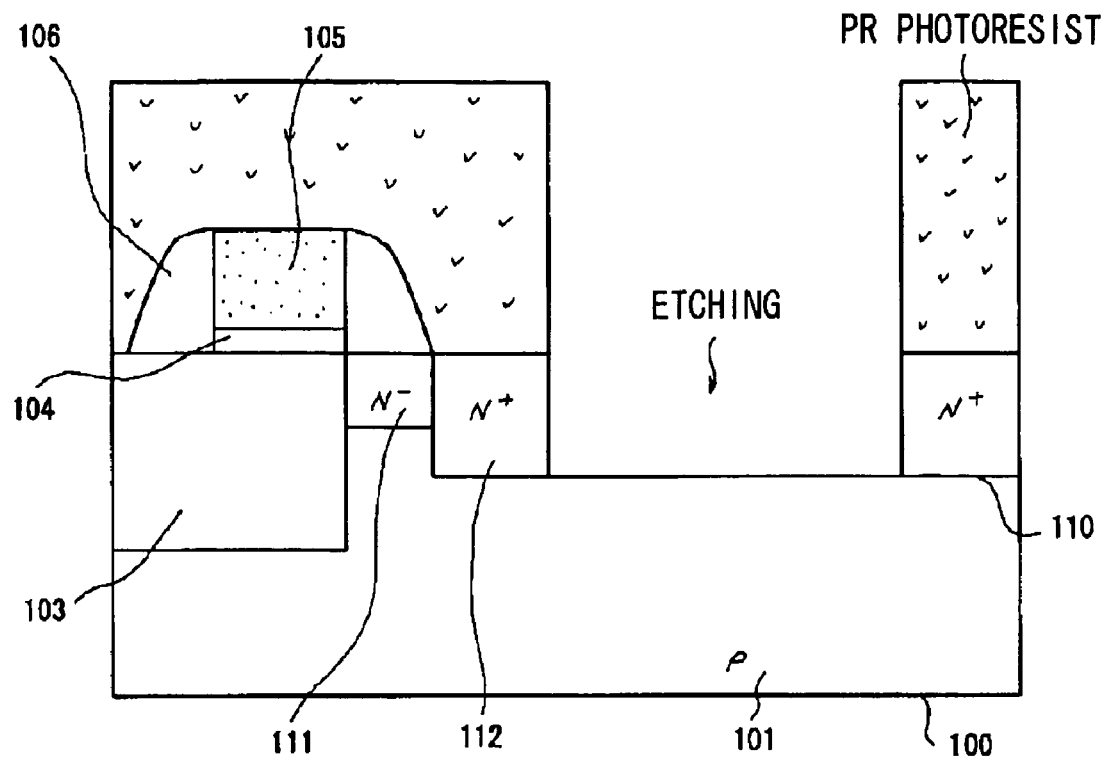
FIGS. 15a and 15b include cross sectional views showing manufacturing steps of the third embodiment.
Figure 15B:
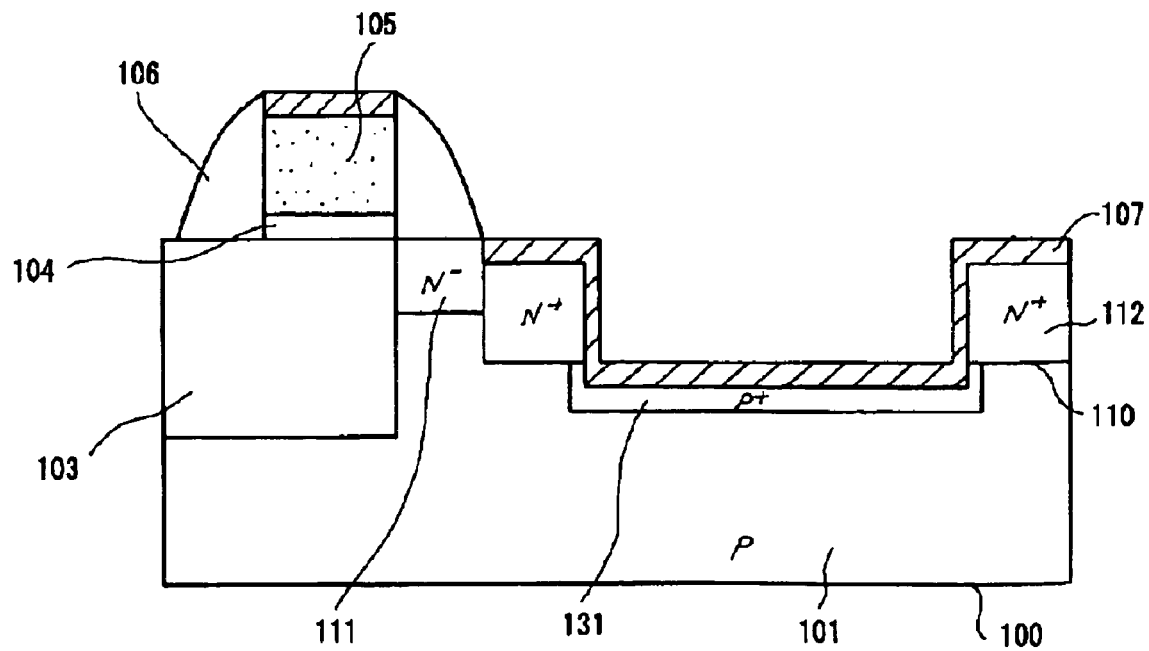
Figure 16:
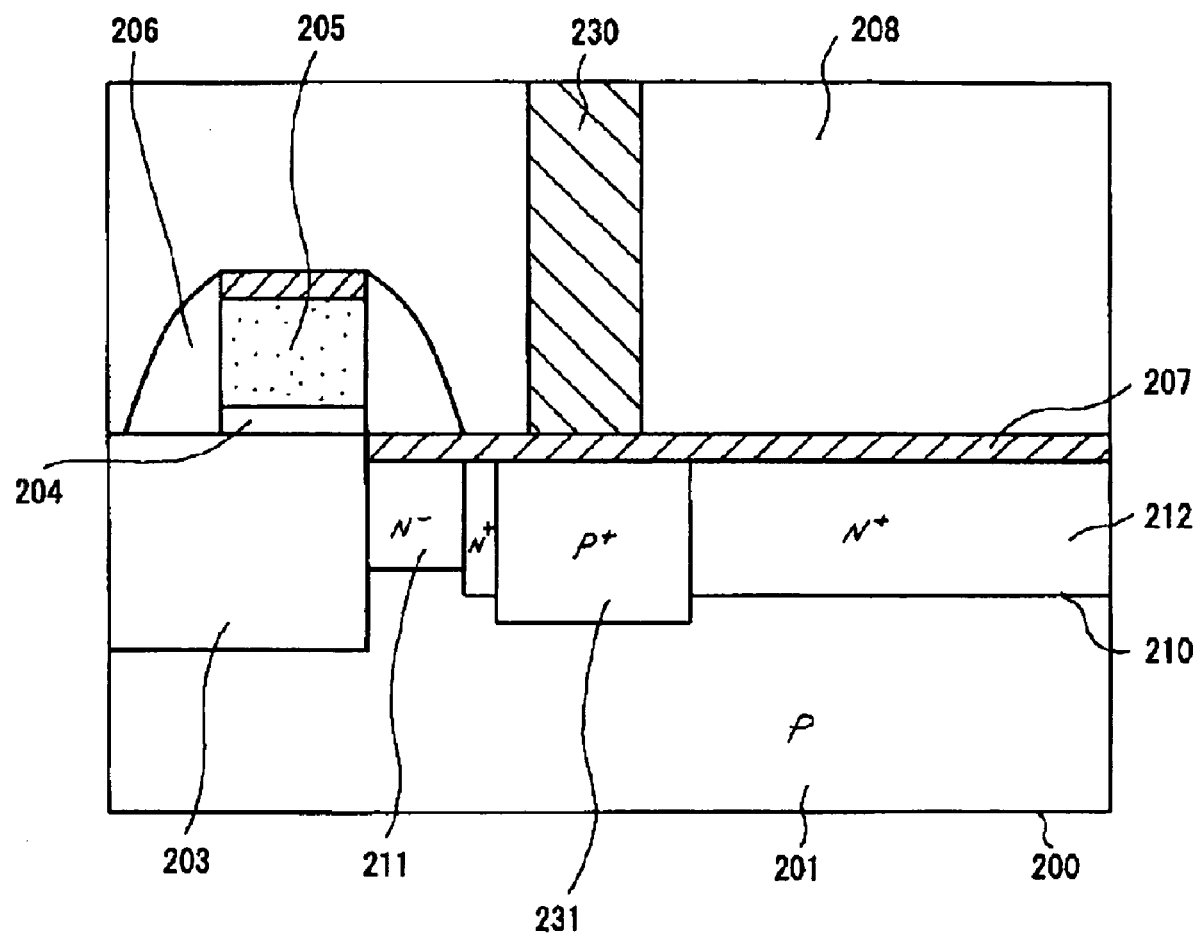
FIG. 16 is a cross sectional view of a first conventional art.
Figure 17:
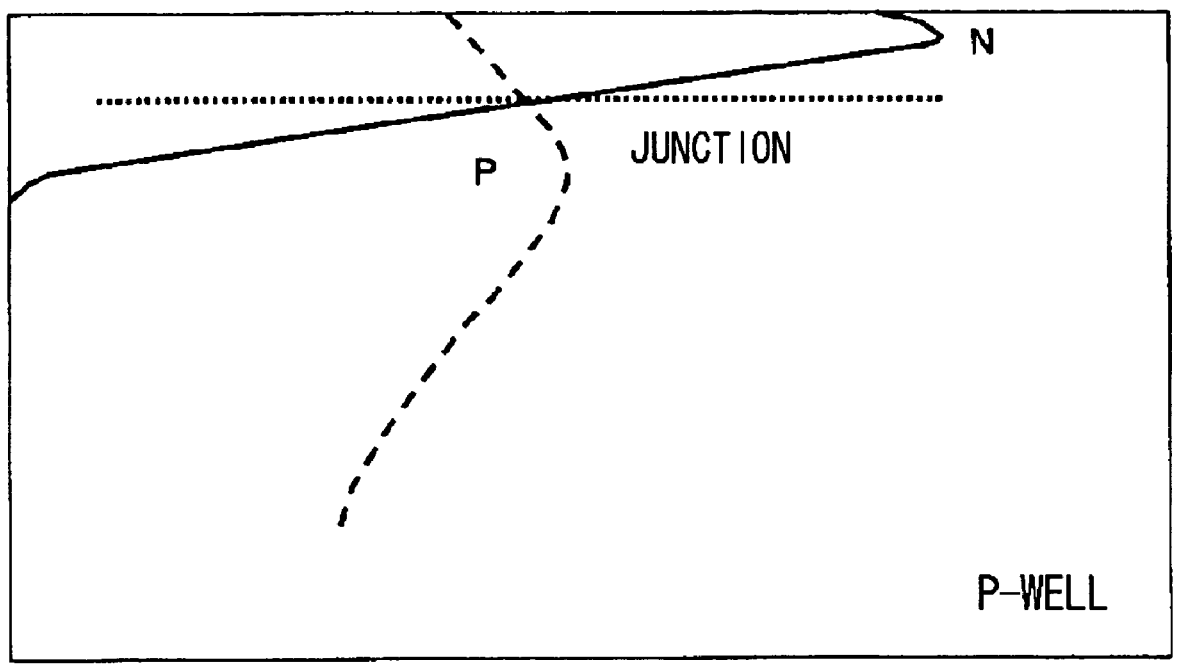
FIG. 17 is a diagram for explaining concentration distributions in an impurity region in the first conventional art.
Figure 18:
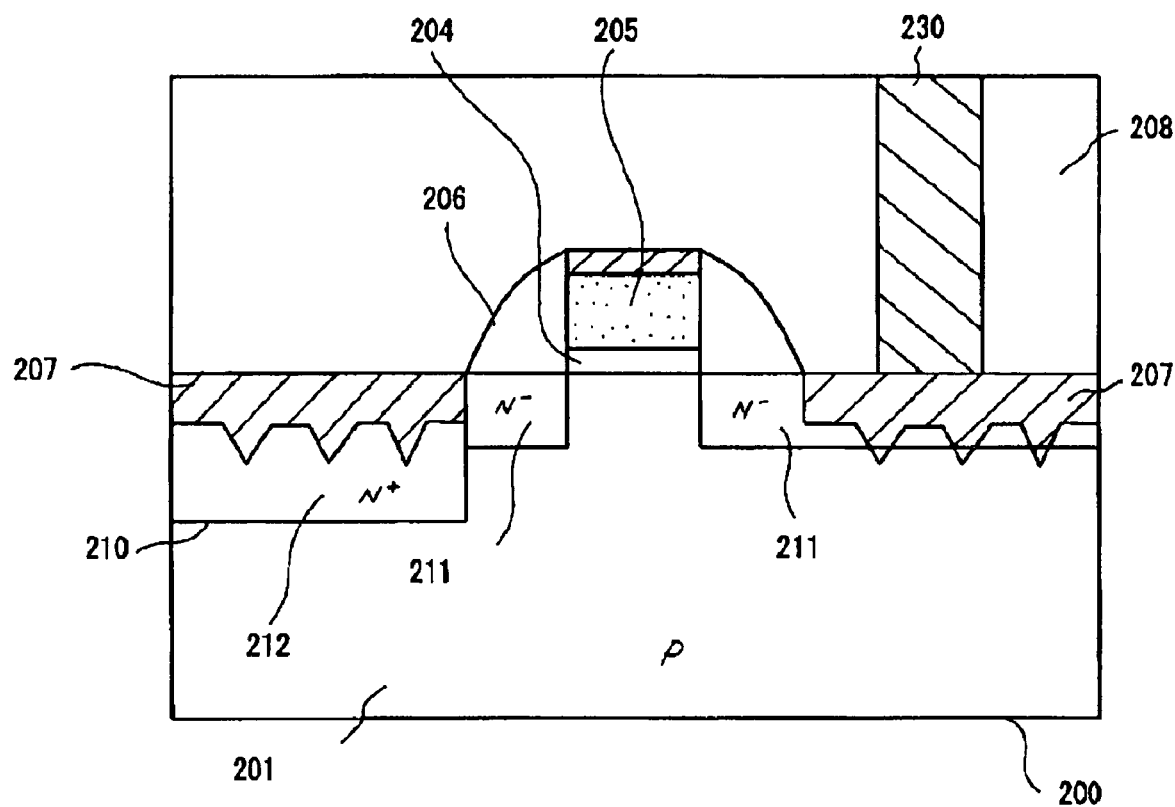
FIG. 18 is a cross sectional view of Patent Document 1.

FIGS. 15a and 15b show cross sectional views taken in the same direction as FIG. 3, which show manufacturing steps. First, as shown in FIG. 15a, after the P-well 101, N-well 102 not shown, and STI 103 are formed in the silicon substrate 100 and then, after the gate insulating film 104 and the gate electrodes 105 are formed, the $N^-$ diffusion layer 111 of the N-type source/drain region 110 having the LDD structure is formed. Next, after the sidewalls 106 have been formed on both the sides of the gate electrodes 105, the $N^+$ diffusion layer 112 of the $N^-$type source/drain region 110 is formed. Though not shown in the drawing, the P-type source/drain region 120 is formed in the same manner with the opposite type. Next, using the photoresist PR as the mask, a portion of the $N^+$ diffusion layer 112 is etched to be deeper than the $N^+$ diffusion layer 112. Then, using the photoresist PR as the mask, the P-type impurity is introduced into the etched region. With this arrangement, the $P^+$ diffusion layer 131 is formed in the region from which the $N^+$ diffusion layer 112 has been etched and removed.

Next, as shown in FIG. 15b, after the photoresist PR has been removed, a metal film with a high melting point such as cobalt is formed above the entire surface of the silicon substrate 100. Then, by the heat treatment, the silicide layer 107 is formed on the upper surfaces of the gate electrodes 105 and the surfaces of the diffusion regions 112 and 131. After the cobalt that is not silicided has been removed, the inter-layer film 108 is formed. Then, the contact holes are opened in the regions of the $P^+$ diffusion layer 131, and a metal such as tungsten is buried therein, so that the GND contacts 130 to be connected to the GND potential are completed.

In the SRAM memory cells in the third embodiment, the P-well 101 for each memory cell is fixed at the GND potential through the GND contact 130, as in the first embodiment. Thus, deterioration of the latch-up immunity can be prevented. With this arrangement, it is not necessary to secure a region for disposing the subcontacts or the well contacts in addition to the region of the memory cells, so that the chip size can be reduced. Further, for formation of each of the GND contacts 130, a portion of the $N^+$ diffusion layer 112 in the N-type source/drain region 110 is etched and removed, and then the $P^+$ diffusion layer 131 for power supply is formed on the etched and removed region. Thus, it is not necessary to form the $P^+$ diffusion layer 131 by changing the conductivity of the N+ diffusion layer 112 by doping a high concentration P-type impurity. Thus, manufacturing can be readily performed. In a further aspect, there is no need for forming a portion of the silicide layer to be deeper than the N– diffusion layer and the $P^-$ diffusion layer as in Patent Document 1, so that the manufacturing can easily be performed in this respect as well. Further, in the third embodiment, the sidewalls 106 are not etched. Thus, alignment tolerances for the steps of etching, implantation of the P-type impurity, and contact formation can be increased by the thickness of the sidewalls 106 in the horizontal direction, thus enabling further facilitation of the manufacturing.

Further, in regard to this third embodiment, assume a case as well where impurity diffusion layers are formed to be asynchronous with one of the diffusion layer being a high-concentration impurity layer (such as an $N^+$ diffusion layer) and the other being a low-concentration impurity layer (an $N^-$ diffusion layer) with gate electrodes sandwiched therebetween, though not shown. By etching and removing a diffusion layer of a conductivity type opposite to that of one well, and then performing implantation of an impurity of a conductivity type which is the same as that of the well into the etched region, GND contact formation can also be performed.

Further, in the third embodiment, the description was directed to the GND contact 130 for the P-well 101 as an example of the variation of the first embodiment. As an example of the variation of the second embodiment, it is needless to say that a portion of the $N^+$ diffusion layer 112 of the N-type source/drain region 110 and a portion of the $P^+$ diffusion layer 122 of the P-type source/drain region 120 can be etched, and that the $P^+$ diffusion layer 131 for providing power supply to the $P^-$well 101 and the $N^+$ diffusion layer 141 for providing power supply to the $N^-$well 102 can be formed in the etched regions as the GND contact 130 and the VDD contact 140, respectively.

In the above description, the present invention is applied to a semiconductor device that constitutes the SRAM memory cells. The present invention can be likewise applied to the structure of a semiconductor device in which a memory cell is constituted from transistors and required potentials are supplied to impurity regions.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   transistor elements each including an impurity region formed in a well of one conductivity type provided in a semiconductor substrate thereof, the impurity region including a conductivity type opposite to the one conductivity type of the well, and the impurity region including a recessed portion;
   contacts each supplying a predetermined potential to the well; and
   a power supply impurity region disposed in the recessed portion in the semiconductor substrate,
   wherein the power supply impurity region is adapted to supply power to the well.

2. The semiconductor device according to claim 1, wherein the impurity region comprises a source/drain region of an MOS transistor including a lightly doped drain (LDD) structure, and the power supply impurity region is disposed beneath the recessed portion.

3. The semiconductor device according to claim 1, wherein the impurity region comprises a high-concentration diffusion layer constituting a source/drain region of an MOS transistor, and
   wherein the power supply impurity region is disposed beneath a recessed portion of the high-concentration diffusion layer.

4. The semiconductor device according to claim 1, wherein a silicide layer is disposed on a surface of the power supply impurity region, and power supply to the power supply impurity region and the well is supplied via the silicide layer.

5. The semiconductor device according to claim 4, wherein a memory cell is comprised of the transistor elements, and the power supply impurity region is provided for each of a plurality of memory cells formed on the semiconductor substrate.

6. The semiconductor device according to claim 4, wherein the silicide layer, when in contact with the contacts and the power supply impurity region, is disposed below a gate electrode.

7. The semiconductor device according to claim 4, wherein the silicide layer, when in contact with the contacts and the power supply impurity region, is disposed below an upper surface of an adjoining isolation layer.

8. The semiconductor device according to claim 4, wherein the silicide layer is disposed above a bottom surface of the impurity region.

9. The semiconductor device according to claim 1, wherein the power supply impurity region is disposed below the recessed portion of the impurity region.

10. The semiconductor device according to claim 1, wherein the power supply impurity region comprises the one conductivity type.

11. The semiconductor device according to claim 1, wherein the power supply impurity region is disposed between the impurity region, and an element isolation region.

12. A semiconductor device including a P-well and an N-well formed in a semiconductor substrate thereof, the semiconductor device comprising:
    N-type MOS transistors disposed in the P-well and P-type MOS transistors disposed in the N-well;
    a P-type impurity region disposed in a recessed portion of a source/drain region of each of the N-type MOS transistors;
    an N-type impurity region disposed in a recessed portion of a source/drain region of each of the P-type MOS transistors; and
    a predetermined potential is supplied to the P-well via the P-type impurity region and a predetermined potential is supplied to the N-well via the N-type impurity region.

13. The semiconductor device according to claim 12, wherein a silicide layer is disposed on a surface of the P-type and N-type impurity regions, and power supply to the P-type and N-type impurity regions and the well is performed via the silicide layer.

14. The semiconductor device according to claim 13, wherein a memory cell is comprised of the N-type and P-type MOS transistors, and the P-type impurity region is provided for each of a plurality of N-type memory cells formed on the semiconductor substrate, and the N-type impurity region is provided for each of a plurality of P-type memory cells formed on the semiconductor substrate.

15. A semiconductor device comprising:
    transistor elements including an impurity region formed in a well of one conductivity type provided in a semiconductor substrate thereof, the impurity region including a conductivity type opposite to the one conductivity type of the well, and the impurity region including a recessed portion;
    contacts supplying a predetermined potential to the well; and
    a power supply impurity region of the one conductivity type disposed below the recessed portion of the impurity region,
    wherein the power supply impurity region is adapted to supply power to the well.

16. The semiconductor device according to claim 15, wherein the predetermined potential is supplied to the power supply impurity region and the well via a silicide layer.

17. The semiconductor device according to claim 16, wherein the silicide layer is disposed on an upper surface of the power supply impurity region.

18. The semiconductor device according to claim 16, wherein the silicide layer is disposed above a bottom surface of the impurity region.

19. The semiconductor device according to claim 16, wherein the silicide layer is disposed on an upper surface of the impurity region.

* * * * *